(12) United States Patent
Chung et al.

(10) Patent No.: US 9,735,267 B1
(45) Date of Patent: Aug. 15, 2017

(54) STRUCTURE AND FORMATION METHOD OF SEMICONDUCTOR DEVICE STRUCTURE

(71) Applicants: Taiwan Semiconductor Manufacturing Co., Ltd., Hsinchu (TW); National Chiao Tung University, Hsinchu (TW)

(72) Inventors: Steve S. Chung, Hsinchu (TW); E-Ray Hsieh, Kaohsiung (TW); Yi-Hsien Lin, New Taipei (TW)

(73) Assignees: TAIWAN SEMICONDUCTOR MANUFACTURING CO., LTD., Hsinchu (TW); NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 15/008,991

(22) Filed: Jan. 28, 2016

(51) Int. Cl.
*H01L 29/78* (2006.01)
*H01L 29/66* (2006.01)

(52) U.S. Cl.
CPC .... *H01L 29/7827* (2013.01); *H01L 29/66666* (2013.01)

(58) Field of Classification Search
None
See application file for complete search history.

(56) References Cited

U.S. PATENT DOCUMENTS

| | | | |
|---|---|---|---|
| 8,120,115 B2 | 2/2012 | Vandenberghe et al. | |
| 8,148,220 B2 | 4/2012 | Verhulst et al. | |
| 8,368,127 B2 | 2/2013 | Zhu et al. | |
| 8,587,075 B2 | 11/2013 | Bhuwalka et al. | |
| 8,796,733 B2 | 8/2014 | Seabaugh et al. | |
| 2010/0047952 A1* | 2/2010 | Ohnuma | H01L 31/0236 438/58 |

(Continued)

FOREIGN PATENT DOCUMENTS

| | | |
|---|---|---|
| CN | 102832256 A | 12/2012 |
| CN | 102906879 A | 1/2013 |

(Continued)

OTHER PUBLICATIONS

Hsieh et al. "Design of Complementary Tilt-gate TFETs with SiGe/Si and III-V Integrations Feasible for Ultra-low-power Applications", Published in 2015 IEEE Silicon Nanoelectronics Workshop, Jun. 14-15, 2015.

*Primary Examiner* — Angel Roman
*Assistant Examiner* — Kevin Quinto
(74) *Attorney, Agent, or Firm* — Birch, Stewart, Kolasch & Birch, LLP

(57) ABSTRACT

Structures and formation methods of a semiconductor device structure are provided. The semiconductor device structure includes a source structure at least partially in a semiconductor substrate. The semiconductor device structure also includes a channel structure over the semiconductor substrate. The source structure is partially covered by the channel structure. The semiconductor device structure further includes a drain structure covering the channel structure. The drain structure and the source structure have different conductivity types. A portion of the channel structure is sandwiched between the source structure and the drain structure. In addition, the semiconductor device structure includes a gate stack partially covering the channel structure.

20 Claims, 19 Drawing Sheets

(56) References Cited

U.S. PATENT DOCUMENTS

| | | | |
|---|---|---|---|
| 2010/0200916 A1* | 8/2010 | Gossner | H01L 29/083 257/335 |
| 2011/0215425 A1* | 9/2011 | Loh | H01L 29/78 257/410 |
| 2012/0292671 A1* | 11/2012 | Baars | H01L 29/6656 257/288 |
| 2012/0298959 A1 | 11/2012 | Verhulst et al. | |
| 2014/0203351 A1* | 7/2014 | Chuang | H01L 29/66356 257/329 |
| 2014/0203352 A1 | 7/2014 | Chuang et al. | |
| 2014/0291616 A1 | 10/2014 | Park et al. | |

FOREIGN PATENT DOCUMENTS

| | | |
|---|---|---|
| CN | 102945861 A | 2/2013 |
| CN | 103117306 A | 5/2013 |
| CN | 103296079 A | 9/2013 |
| EP | 2148374 A1 | 1/2010 |

* cited by examiner

STRUCTURE AND FORMATION METHOD OF SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
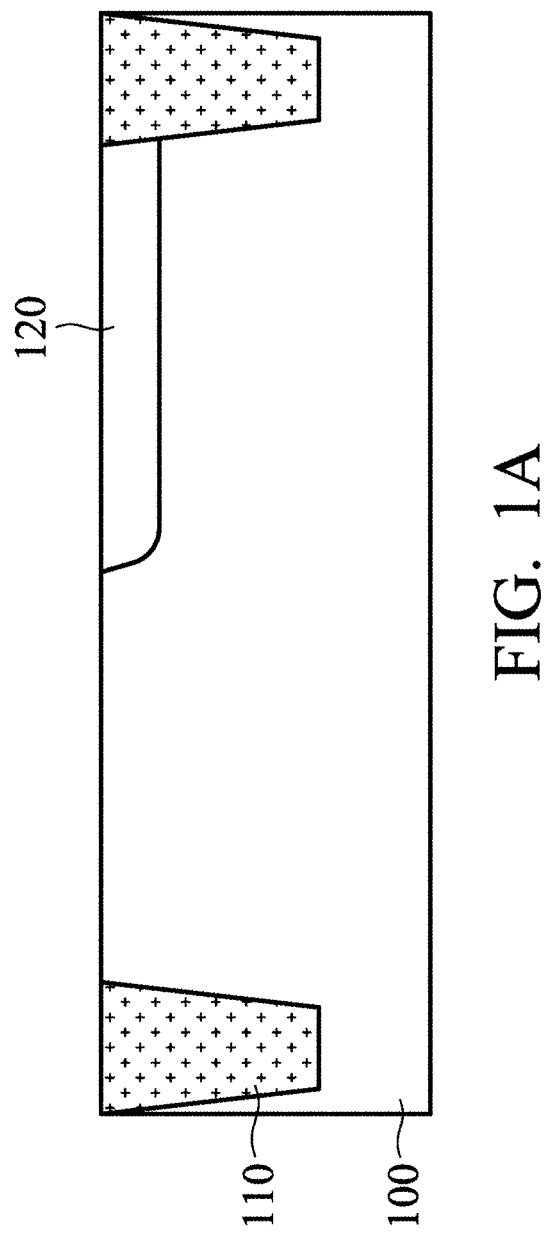
FIGS. 1A-1F are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1G are cross-sectional views of various stages of a process for forming a semiconductor device structure, in accordance with some embodiments. Additional operations can be provided before, during, and/or after the stages described in FIGS. 1A-1G. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include silicon germanium, gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated by using a wafer bonding process, a silicon film transfer process, a separation by implantation of oxygen (SIMOX) process, another applicable method, or a combination thereof.

As shown in FIG. 1A, isolation features 110 are formed in the semiconductor substrate 100, in accordance with some embodiments. The isolation features 110 are used to define active regions and electrically isolate various device elements formed in and/or over the semiconductor substrate 100 in the active regions. In some embodiments, the isolation features 110 include shallow trench isolation (STI) features, local oxidation of silicon (LOCOS) features, other suitable isolation features, or a combination thereof.

In some embodiments, each of the isolation features 110 has a multi-layer structure. In some embodiments, the isolation features 110 are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation features 110.

In some embodiments, multiple recesses (or trenches) are formed in the semiconductor substrate 100. In some embodiments, one or more photolithography and etching processes are used to form the recesses. Afterwards, a dielectric material layer is deposited over the semiconductor substrate 100. The dielectric material layer fills the recesses. In some embodiments, the dielectric material layer is deposited using a chemical vapor deposition (CVD) process, a spin-on process, another applicable process, or a combination thereof. In some embodiments, a planarization process is performed to thin down the dielectric material layer until the top surface of the semiconductor substrate 100 is exposed. The planarization process may include a chemical mechanical polishing (CMP) process, a grinding process, an etching process, another applicable process, or a combination thereof.

As shown in FIG. 1A, a source structure 120 is formed in the semiconductor substrate 100, in accordance with some embodiments. In some embodiments, the source structure 120 adjoins one or some of the isolation features 110. In some other embodiments, the source structure 120 is not in direct contact with the isolation features 110.

In some embodiments, the source structure 120 is doped with one or more N-type or P-type dopants. For example, the semiconductor substrate 100 includes silicon and the source structure 120 is doped with phosphorus (P), arsenic (As), or another suitable dopant. Alternatively, the semiconductor substrate 100 includes silicon germanium and the source structure 120 is doped with boron (B) or another suitable dopant. In some embodiments, the concentration of the dopant in the source structure 120 is in a range from about $10^{19}$ atoms/cm$^3$ to about $10^{21}$ atoms/cm$^3$.

In some embodiments, one or multiple implantation processes are performed over the semiconductor substrate 100 so as to form the source structure 120. In some embodiments, an implantation mask (not shown) is used to ensure that dopants are implanted into a region where the source structure 120 is designed to form. In some embodiments, after the implantation process(es), a thermal operation is performed to activate the dopants so as to form the source structure 120. For example, a rapid thermal annealing process is performed.

Embodiments of the disclosure are not limited thereto. In some other embodiments, the source structure 120 includes epitaxial structures. In some embodiments, the source structure 120 includes a P-type or N-type semiconductor material. For example, the source structure 120 may include epitaxially grown silicon, silicon-germanium (SiGe), epitaxially grown phosphorous-doped silicon (SiP), boron-doped silicon germanium (SiGeB) or another suitable epitaxially grown semiconductor material.

In some embodiments, the semiconductor substrate 100 is partially removed to form a recess positioned at a location where the source structure 120 will be formed. In some embodiments, one or more photolithography and etching processes are used to form the recess. Afterwards, a semiconductor material (or two or more semiconductor materials) is epitaxially grown in the recess so as to form the source structure 120. In some embodiments, the lower portion of the source structure 120 is in the semiconductor substrate 100, and the upper portion of the source structure 120 protrudes from the top surface of the semiconductor substrate 100.

In some embodiments, the source structure 120 is formed using a selective epitaxy growth (SEG) process, a CVD process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g. Si, Ge or SiGe) followed by a solid-phase epitaxial recrystallization (SPER) step, another applicable process, or a combination thereof. The formation process of the source structure 120 may use gaseous and/or liquid precursors.

In some embodiments, the source structure 120 is doped in-situ during the growth of the source structure 120. In some other embodiments, the source structure 120 is not doped during the growth of the source structure 120. After the epitaxial growth, the source structure 120 is doped in a subsequent process. In some embodiments, the doping is achieved using an ion implantation process, a plasma immersion ion implantation process, a gas and/or solid source diffusion process, another applicable process, or a combination thereof. In some embodiments, the source structure 120 is further exposed to annealing processes to activate the dopants. For example, a rapid thermal annealing process is performed.

Figure 1B:
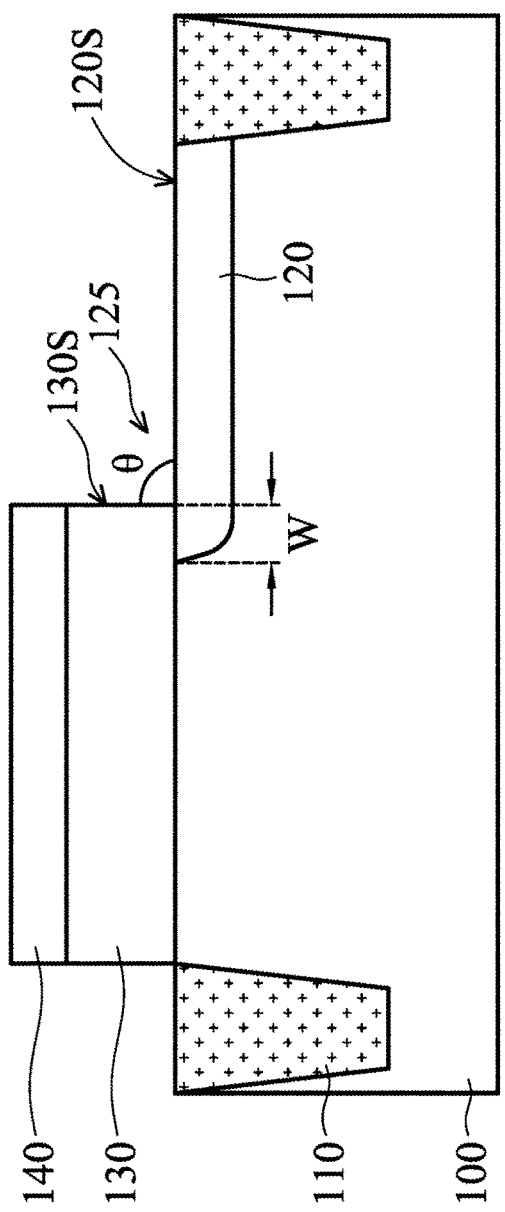

As shown in FIG. 1B, a channel structure 130 is formed over the semiconductor substrate 100, in accordance with some embodiments. In some embodiments, the channel structure 130 partially covers the source structure 120. In some embodiments, the channel structure 130 has a portion vertically overlapping the source structure 120. In some embodiments, the portion of the channel structure 130 is in direct contact with the source structure 120. In some embodiments, the portion of the channel structure 130 overlapping the source structure 120 has a width W in a range from about 5 nm to about 30 nm.

As shown in FIG. 1B, a corner 125 is created between the channel structure 130 and the source structure 120, in accordance with some embodiments. In some embodiments, a sidewall 130S of the channel structure 130 is substantially perpendicular to a top surface 120S of the source structure 120. In some other embodiments, the sidewall 130S is inclined to the top surface 120S.

In some embodiments, an angle θ of the corner 125 between the sidewall 130S and the top surface 120S is in a range from about 90 degrees to about 145 degrees. In some other embodiments, the angle θ is in a range from about 30 degrees to about 90 degrees. In some embodiments of forming N-type tunneling field-effect transistors (TFETs), the angle θ is in a range from about 30 degrees to about 145 degrees. On the other hand, in some embodiments of forming P-type TFETs, the angle θ is in a range from about 30 degrees to about 125 degrees.

In some embodiments, a patterned mask layer (not shown) is formed over the semiconductor substrate 100. The patterned mask layer is used to assist in the formation of the channel structure 130. The patterned mask layer has an opening exposing a portion of the semiconductor substrate 100 and the source structure 120 at a location where the channel structure 130 will be formed. The profile of the opening in the patterned mask layer can be fine-tuned to adjust the profile of the subsequently formed channel structure 130 and the angle θ of the resulted corner 125. In some embodiments, the patterned mask layer is made of silicon oxide, silicon nitride, another suitable material, or a combination thereof.

For example, a material layer (mask layer) is deposited over the semiconductor substrate 100. Afterwards, a photoresist layer is deposited over the material layer and is patterned by one or more photolithography processes. The patterned photoresist is used as an etching mask to pattern the material layer. Afterwards, one or more etching processes are used to transfer the pattern of the patterned photoresist to the material layer. As a result, the patterned mask layer is formed. The patterned photoresist is subsequently removed. In some other embodiments, a patterned photoresist layer is used directly as the patterned mask layer.

Afterwards, a semiconductor material (or two or more semiconductor materials) is deposited over the semiconductor substrate 100. The deposition of the semiconductor material is selective due to the patterned mask layer. The semiconductor material is deposited over the semiconductor substrate 100 and the source structure 120 exposed by the opening of the patterned mask layer. As a result, the channel structure 130 is formed. In some embodiments, the deposited semiconductor material is lower than the top surface of the patterned mask layer. In some other embodiments, the deposition of the semiconductor material is performed until the semiconductor material is substantially level with, or higher than, the top surface of the patterned mask layer.

For example, the semiconductor material may include epitaxially grown silicon, epitaxially grown silicon-germanium, or another suitable epitaxially grown semiconductor material. In some embodiments, the channel structure 130 and the source structure 120 include or are made of different materials. For example, the channel structure 130 includes germanium and the source structure 120 includes silicon. In some other embodiments, the channel structure 130 and the source structure 120 include or are made of the same material. For example, the channel structure 130 and the source structure 120 include silicon germanium. In some embodiments, the semiconductor material is deposited using a SEG process, a CVD process (e.g., a vapor-phase epitaxy (VPE) process, a low pressure CVD (LPCVD) process, and/or an ultra-high vacuum CVD (UHV-CVD) process), a molecular beam epitaxy process, another applicable process, or a combination thereof.

As shown in FIG. 1B, a drain structure 140 is formed over the semiconductor substrate 100, in accordance with some embodiments. In some embodiments, the drain structure 140 is vertically stacked over the channel structure 130 and the source structure 120. In some embodiments, a bottom surface of the drain structure 140 is over the top surface 120S of the source structure 120. In some embodiments, the drain structure 140 covers the channel structure 130. In some embodiments, the drain structure 140 is in direct contact with the channel structure 130. In some embodiments, the channel structure 130 has a portion sandwiched between the drain structure 140 and the source structure 120. The portion of the channel structure 130 serves as a channel region of transistors. In some embodiments, the channel region of transistors is vertical with respect to the top surface 120S of the source structure 120. In some other embodiments, the channel region of transistors is inclined to the top surface 120S of the source structure 120.

In some embodiments, the drain structure 140 and the channel structure 130 have the same size. In some other embodiments, the drain structure 140 and the channel structure 130 have different sizes. For example, the drain structure 140 may be narrower than the channel structure 130 and a portion of the underlying channel structure 130 may not be covered by the drain structure 140.

In some embodiments, the patterned mask layer for forming the channel structure 130 is also used to assist in the formation of the drain structure 140. In some embodiments, a semiconductor material (or two or more semiconductor materials) is selectively deposited over the channel structure 130 due to the patterned mask layer. The semiconductor material is deposited over the channel structure 130 exposed by the opening of the patterned mask layer. As a result, the drain structure 140 is formed. The deposition of the semiconductor material may be performed until the semiconductor material is substantially level with, or higher than, the top surface of the patterned mask layer. The patterned mask layer is subsequently removed. Embodiments of the disclosure are not limited thereto. In some other embodiments, different patterned mask layers are used to sequentially assist in the formations of the channel structure 130 and the drain structure 140.

The profile of the opening in the patterned mask layer can be fine-tuned to adjust the profile of the subsequently formed drain structure 140. In some embodiments, a sidewall of the drain structure 140 is substantially perpendicular to the top surface 120S of the source structure 120. In some other embodiments, a sidewall of the drain structure 140 is inclined to the top surface 120S.

In some embodiments, the drain structure 140 includes epitaxially grown silicon, epitaxially grown silicon-germanium, epitaxially grown phosphorous-doped silicon, boron-doped silicon germanium or another suitable epitaxially grown semiconductor material. In some embodiments, the drain structure 140 and the source structure 120 include or are made of different materials. In some other embodiments, the drain structure 140 and the source structure 120 include or are made of the same material. In some embodiments, the drain structure 140 and the channel structure 130 include or are made of the same material. In some other embodiments, the drain structure 140 and the channel structure 130 include or are made of different materials.

In accordance with some embodiments, the drain structure 140 and the source structure 120 include or are made of the same material that is different from the material of the channel structure 130. Hetero-P-I-N junction creates a bandgap mismatch. As a result, band-to-band tunneling probability is increased. Therefore, driving or tunneling current ($I_{on}$) of TFETs is significantly enhanced.

In some embodiments, the drain structure 140 is formed using a SEG process, a CVD process (e.g., a VPE process, a LPCVD process, and/or an UHV-CVD process), a molecular beam epitaxy process, deposition of doped amorphous semiconductor (e.g. Si, Ge or SiGe) followed by a SPER step, another applicable process, or a combination thereof. The formation process of the drain structure 140 may use gaseous and/or liquid precursors.

In some embodiments, the drain structure 140 is doped with one or more N-type or P-type dopants. For example, the drain structure 140 is doped with P, As, Sb, or another suitable dopant. Alternatively, the drain structure 140 is doped with B or another suitable dopant. In some embodiments, the concentration of the dopant in the drain structure 140 is in a range from about $10^{19}$ atoms/cm$^3$ to about $10^{21}$ atoms/cm$^3$. In some embodiments, multiple implantation processes are performed to dope the drain structure 140.

In some embodiments, the dopants in the drain structure 140 and the source structure 120 are different types. In some embodiments, the drain structure 140 is doped with P-type dopants while the source structure 120 is doped with N-type dopants. Therefore, one or more P-type TFETs will be fabricated. In some other embodiments, the drain structure 140 is doped with N-type dopants while the source structure 120 is doped with P-type dopants. Therefore, one or more N-type TFETs will be fabricated.

In some embodiments, the drain structure 140 is doped in-situ during the growth of the drain structure 140. In some other embodiments, the drain structure 140 is not doped during the growth of the drain structure 140. After the epitaxial growth, the drain structure 140 is doped in a subsequent process. In some embodiments, the doping is achieved using an ion implantation process, a plasma immersion ion implantation process, a gas and/or solid source diffusion process, another applicable process, or a combination thereof. In some embodiments, the drain structure 140 is further exposed to annealing processes to activate the dopants. For example, a rapid thermal annealing process is performed.

Many variations and modifications can be made to embodiments of the disclosure. In some other embodiments, the epitaxial growth of the channel structure 130 and the drain structure 140 is performed in the same stage. In some embodiments, a semiconductor material (or two or more semiconductor materials) is deposited over the semiconductor substrate 100. Afterwards, the upper portion of the semiconductor material is doped with suitable dopants. As a result, the upper portion of the semiconductor material forms the drain structure 140, and the lower portion of the semiconductor material forms the channel structure 130.

Figure 1C:
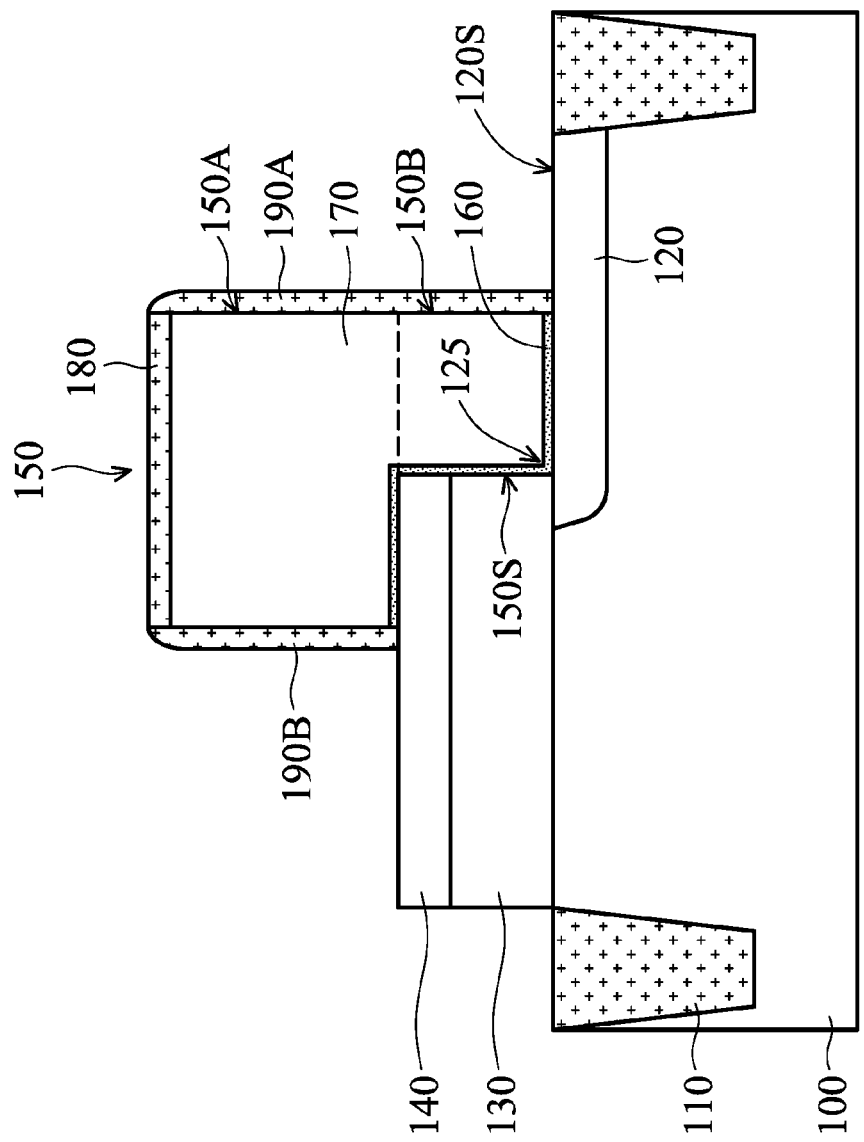

As shown in FIG. 1C, a gate stack 150 is formed over the semiconductor substrate 100, in accordance with some embodiments. The gate stack 150 partially covers the channel structure 130 and the source structure 120. In some embodiments, a bottom surface of the gate stack 150 is below a top surface of the channel structure 130. In some embodiments, a portion of the gate stack 150 fills the corner 125 between the channel structure 130 and the source structure 120. In some embodiments, a sidewall 150S of the gate stack 150 is substantially perpendicular to the top surface 120S of the source structure 120. In some other embodiments, the sidewall 150S is inclined to the top surface 120S.

In some embodiments, the gate stack 150 extends further over the drain structure 140. In some embodiments, the upper portion 150A of the gate stack 150 is wider than the lower portion 150B of the gate stack 150. In some embodiments, a sidewall of the upper portion 150A of the gate stack 150 is not coplanar with the sidewall 150S of the lower portion 150B of the gate stack 150.

In some embodiments, the gate stack 150 includes a gate dielectric layer 160, a gate electrode 170 over the gate dielectric layer 160, and a hard mask 180 over the gate electrode 170. The gate dielectric layer 160 may serve as an etch stop layer during subsequent etching processes.

In some embodiments, the gate dielectric layer 160 is made of silicon oxide, silicon nitride, silicon oxynitride, dielectric material with high dielectric constant (high-K), another suitable dielectric material, or a combination thereof. In some embodiments, the gate dielectric layer 160 is a dummy gate dielectric layer which will be removed in a subsequent gate replacement process. The dummy gate dielectric layer 160 is, for example, a silicon oxide layer. In some embodiments, the gate dielectric layer 160 is conformally deposited over the source structure 120, the channel structure 130 and the drain structure 140. The gate dielectric layer 160 may be deposited using a CVD process, an atomic layer deposition (ALD) process, a PVD process, a spin-on process, another applicable process, or a combination thereof.

In some embodiments, the gate electrode 170 includes polysilicon, a metal material, another suitable conductive material, or a combination thereof. In some embodiments, the gate electrode 170 is a dummy gate electrode and will be replaced with another conductive material, such as one or more metal materials. The dummy gate electrode 170 is made of, for example, polysilicon.

In some embodiments, the hard mask 180 may serve as an etching mask during the formation of the gate electrode 170. The hard mask 180 may also protect the gate electrode 170 during subsequent processes. In some embodiments, the hard mask 180 is made of silicon nitride, silicon oxynitride, silicon carbide, silicon oxide, silicon carbon nitride, another suitable material, or a combination thereof. In some embodiments, the hard mask 180 has a multi-layer structure. Many variations and modifications can be made to embodiments of the disclosure. In some other embodiments, the hard mask 180 is not formed.

In some embodiments, a gate electrode layer and one or more hard mask layers are deposited over the gate dielectric layer 160. In some embodiments, the gate electrode layer and the hard mask layer are sequentially deposited by using suitable deposition methods. The suitable deposition methods may include a chemical vapor deposition process, an atomic layer deposition process, a thermal oxidation process, a physical vapor deposition process, another applicable process, or a combination thereof. Afterwards, a photolithography process and an etching process are performed to pattern the hard mask layer so as to form the hard mask 180.

With the assistance of the hard mask 180, the gate electrode layer is patterned. As a result, the gate electrode 170 is formed. During the etching process for forming the gate electrode 170, the gate dielectric layer 160 may serve as an etch stop layer to protect the source structure 120, the channel structure 130 and the drain structure 140. Afterwards, the portions of the gate dielectric layer 160 that are not covered by the gate electrode 170 are removed using, for example, another etching process. As a result, the gate dielectric layer 160 is patterned, and the gate stack 150 is formed, as shown in FIG. 1C.

Embodiments of the disclosure are not limited thereto. In some other embodiments, the gate stack 150 is not a dummy gate stack and will not be removed. In some embodiments, the gate stack 150 further includes an interfacial layer (IL) below the gate dielectric layer 160. The interfacial layer may be used to form a high-quality interface with a low-density of defects and create a barrier against interfacial reactions and/or diffusion between a dielectric material and a semiconductor material. In some embodiments, the interfacial layer is made of silicon oxide. In some embodiments, the interfacial layer is formed using an ALD process, a thermal oxidation process, another applicable process, or a combination thereof. In some other embodiments, the gate stack 150 does not include the interfacial layer. In some embodiments, the gate dielectric layer 160 is in direct contact with the source structure 120, the channel structure 130 and the drain structure 140.

As shown in FIG. 1C, spacer elements 190A and 190B are formed over sidewalls of the gate stack 150, in accordance with some embodiments. In some embodiments, the spacer element 190A covers the sidewalls of the upper portion 150A and the lower portion 150B of the gate stack 150. In some embodiments, the spacer element 190B covers another sidewall of the upper portion 150A of the gate stack 150. In some embodiments, the sidewall 150S of the lower portion 150B of the gate stack 150 is not covered by the spacer elements 190A and 190B. In some embodiments, the spacer elements 190A and 190B have different heights. For example, the spacer elements 190A are taller than the spacer elements 190B.

In some embodiments, the spacer element 190A covers the source structure 120. In some embodiments, the lower portion 150B of the gate stack 150 is sandwiched between the spacer elements 190A and the channel structure 130. In some embodiments, the spacer element 190B covers the drain structure 140. In some embodiments, the spacer elements 190B vertically overlap the channel structure 130. In some embodiments, a portion of the drain structure 140 is sandwiched between the spacer element 190B and the channel structure 130.

In some embodiments, the spacer elements 190A and 190B are made of silicon nitride, silicon oxynitride, silicon carbide, another suitable material, or a combination thereof. In some embodiments, a spacer layer is deposited over the semiconductor substrate 100. The spacer layer may be deposited using a CVD process, a PVD process, a spin-on process, another applicable process, or a combination thereof. Afterwards, an etching process, such as an anisotropic etching process, is performed to partially remove the spacer layer. As a result, the remaining portions of the spacer layer over the sidewalls of the gate stack 150 form the spacer elements 190A and 190B.

Figure 1D:
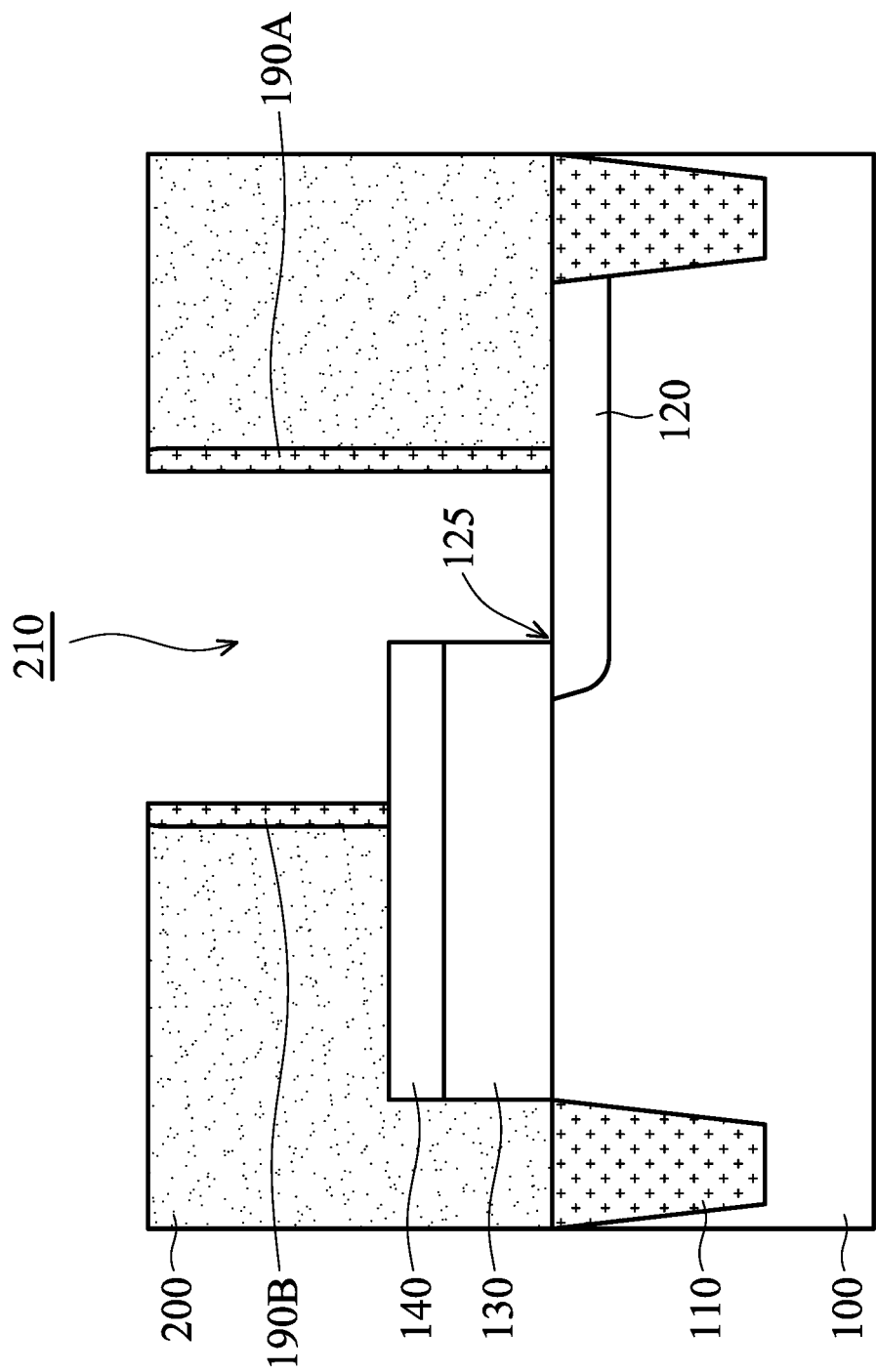

As shown in FIG. 1D, a dielectric layer 200 is deposited over the semiconductor substrate 100, in accordance with some embodiments. The dielectric layer 200 serves as an interlayer dielectric layer. In some embodiments, the dielectric layer 200 is made of silicon oxide, silicon oxynitride, borosilicate glass (BSG), phosphosilicate glass (PSG), borophosphosilicate glass (BPSG), fluorinated silicate glass (FSG), low-K material, porous dielectric material, another suitable dielectric material, or a combination thereof.

In some embodiments, the dielectric layer 200 is deposited using a CVD process, a spin-on process, an ALD process, a PVD process, another applicable process, or a combination thereof. In some embodiments, the dielectric layer 200 covers and surrounds the channel structure 130, the drain structure 140, the gate stack 150, and the spacer elements 190A and 190B. Afterwards, the dielectric layer 200 is thinned down until the gate electrode 170 is exposed. In some embodiments, a planarization process is performed to thin down the dielectric layer 200. The planarization process may include a CMP process, a grinding process, an etching process, another applicable process, or a combination thereof. In some embodiments, the hard mask 180 and the upper portions of the spacer elements 190A and 190B are removed during the planarization process.

As shown in FIG. 1D, the dummy gate stack 150 is removed, in accordance with some embodiments. As a result, a trench 210 is formed over the semiconductor substrate 100. In some embodiments, the trench 210 exposes a portion of the source structure 120, the channel structure 130 and the drain structure 140 that was previously covered by the gate dielectric layer 160 and gate electrode 170. In some embodiments, the trench 210 exposes the corner 125 between the channel structure 130 and the source structure 120. In some embodiments, the dummy gate stack 150 is removed using a wet etching process, a dry etching process, another applicable process, or a combination thereof.

Figure 1E:
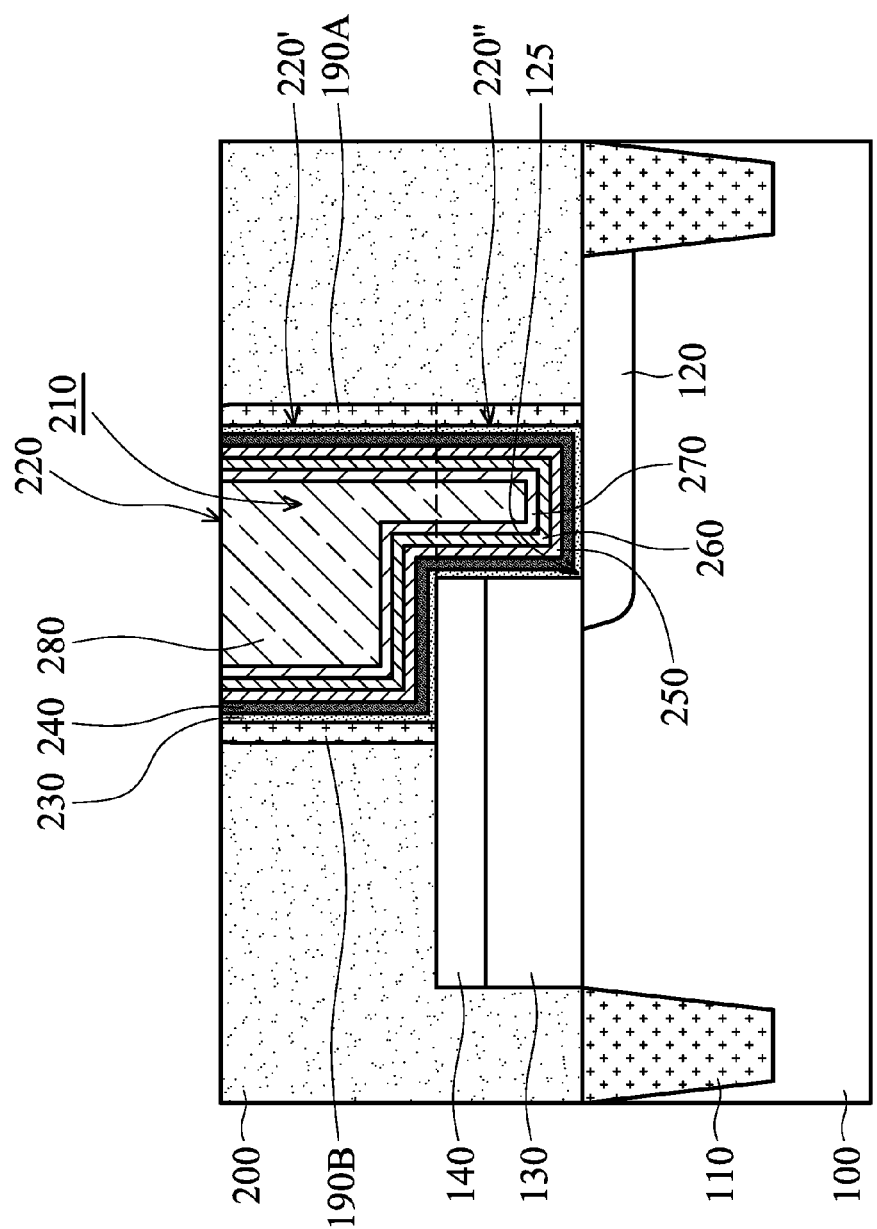

As shown in FIG. 1E, a gate stack 220 is formed in the trench 210, in accordance with some embodiments. In some embodiments, the upper portion 220' of the gate stack 220 is wider than the lower portion 220" of the gate stack 220. In some embodiments, a sidewall of the upper portion 220' is not coplanar with a sidewall of the lower portion 220". In some embodiments, the gate stack 220 includes an interfacial layer 230, a gate dielectric layer 240, and a metal gate stack structure.

As shown in FIG. 1E, the interfacial layer 230 is deposited over the sidewalls and the bottoms of the trench 210, in accordance with some embodiments. In some embodiments, the interfacial layer 230 is made of silicon oxide. In some embodiments, the interfacial layer 230 is made of germanium oxide. In some other embodiments, the interfacial layer 230 is made of silicon germanium oxide or another suitable material. In some embodiments, the interfacial layer 230 is formed using an ALD process, a thermal oxidation process, another applicable process, or a combination thereof. In some other embodiments, the gate stack 220 does not include the interfacial layer 230. In some embodiments, the gate dielectric layer 240 is in direct contact with the source structure 120, the channel structure 130 and the drain structure 140.

As shown in FIG. 1E, the gate dielectric layer 240 is deposited over the interfacial layer 230, in accordance with some embodiments. In some embodiments, the gate dielectric layer 240 conformally extends over the sidewalls and the bottoms of the trench 210. In some embodiments, the gate dielectric layer 240 is a high-K dielectric layer. The high-K dielectric layer may be made of hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

In some embodiments, the gate dielectric layer 240 is deposited using an ALD process, a CVD process, a spin-on process, another applicable process, or a combination thereof. In some embodiments, a high-temperature annealing operation is performed to reduce or eliminate defects in the gate dielectric layer 240.

The metal gate stack structure is deposited over the gate dielectric layer 240. In some embodiments, the metal gate stack structure includes multiple metal gate stacking layers. In some embodiments, the metal gate stacking layers include a barrier layer 250, a work function layer 260, a blocking layer 270, and a metal filling layer 280. Some of these metal gate stacking layers can be replaced or eliminated for different embodiments. Additional layers can be added into the metal gate stack structure.

As shown in FIG. 1E, the barrier layer 250 is deposited over the gate dielectric layer 240, in accordance with some embodiments. The barrier layer 250 may be used to allow the gate dielectric layer 240 to interface with the subsequently formed work function layer 260. The barrier layer 250 may also be used to prevent diffusion between the gate dielectric layer 240 and the subsequently formed work function layer 260. In some embodiments, the barrier layer 250 conformally extends over the sidewalls and the bottoms of the trench 210.

In some embodiments, the barrier layer 250 is made of a metal-containing material. The metallic material may include titanium nitride, tantalum nitride, another suitable material, or a combination thereof. In some embodiments, the barrier layer 250 includes multiple layers. In some embodiments, the barrier layer 250 is deposited using an ALD process, a PVD process, an electroplating process, an electroless plating process, a CVD process, another applicable process, or a combination thereof. In some other embodiments, the barrier layer 250 is not formed.

As shown in FIG. 1E, the work function layer 260 is formed over the barrier layer 250, in accordance with some embodiments. The work function layer 260 is used to provide the desired work function for transistors to enhance device performance including improved threshold voltage. In some embodiments, the work function layer 260 conformally extends over the sidewalls and the bottoms of the trench 210.

In some embodiments of forming an N-type TFET, the work function layer 260 can be an N-type metal layer. The N-type metal layer may include metal, metal carbide, metal nitride, or a combination thereof. For example, the N-type metal layer includes titanium nitride, tantalum, tantalum nitride, another suitable material, or a combination thereof.

On the other hand, in some embodiments of forming a P-type TFET, the work function layer 260 can be a P-type metal layer. The P-type metal layer may include metal, metal carbide, metal nitride, other suitable materials, or a combination thereof. For example, the P-type metal includes tantalum nitride, tungsten nitride, titanium, titanium nitride, other suitable materials, or a combination thereof.

The work function layer 260 may also be made of hafnium, zirconium, titanium, tantalum, aluminum, metal carbides (e.g., hafnium carbide, zirconium carbide, titanium carbide, aluminum carbide), metal nitrides, ruthenium, palladium, platinum, cobalt, nickel, conductive metal oxides, or a combinations thereof. The thickness and/or the composition of the work function layer 260 may be fine-tuned to adjust the work function level. For example, a titanium nitride layer may be used as a P-type metal layer or an N-type metal layer, depending on the thickness and/or the composition of the titanium nitride layer.

As shown in FIG. 1E, the blocking layer 270 is deposited over the work function layer 260, in accordance with some embodiments. The blocking layer 270 may be used to prevent the subsequently formed metal filling layer 280 from diffusing or penetrating into the work function layer 260. In some embodiments, the blocking layer 270 conformally extends over the sidewalls and the bottom of the trench 210.

In some embodiments, the blocking layer 270 is made of tantalum nitride, titanium nitride, another suitable material, or a combination thereof. In some embodiments, the blocking layer 270 is deposited using an ALD process, a PVD process, an electroplating process, an electroless plating process, another applicable process, or a combination thereof. In some other embodiments, the blocking layer 270 is not formed.

As shown in FIG. 1E, the metal filling layer 280 is deposited over the blocking layer 270 to fill the trench 210, in accordance with some embodiments. In some embodiments, the metal filling layer 280 is made of tungsten, aluminum, copper, cobalt, another suitable material, or a combination thereof. In some embodiments, the metal filling layer 280 is deposited using a PVD process, a CVD process, an electroplating process, an electroless plating process, another applicable process, or a combination thereof. In some other embodiments, the metal filling layer 280 is not formed.

In some embodiments, the interfacial layer 230, the gate dielectric layer 240 and the metal gate stacking layers together fill the trench 210. In some embodiments, the portions of the interfacial layer 230, the gate dielectric layer 240 and the metal gate stacking layers outside of the trench 210 cover the dielectric layer 200. Afterwards, the portions of the interfacial layer 230, the gate dielectric layer 240 and the metal gate stacking layers outside of the trench 210 are removed. As a result, the metal gate stacking layers remaining in the trench 210 together form the metal gate stack structure. The interfacial layer 230, the gate dielectric layer 240 and the metal gate stack structure remaining in the trench 210 together form the gate stack 220. For example, a planarization process is used to partially remove the interfacial layer 230, the gate dielectric layer 240 and the metal gate stacking layers outside of the trench 210. The planarization process may include a CMP process, a grinding process, an etching process, another applicable process, or a combination thereof.

Figure 1F:
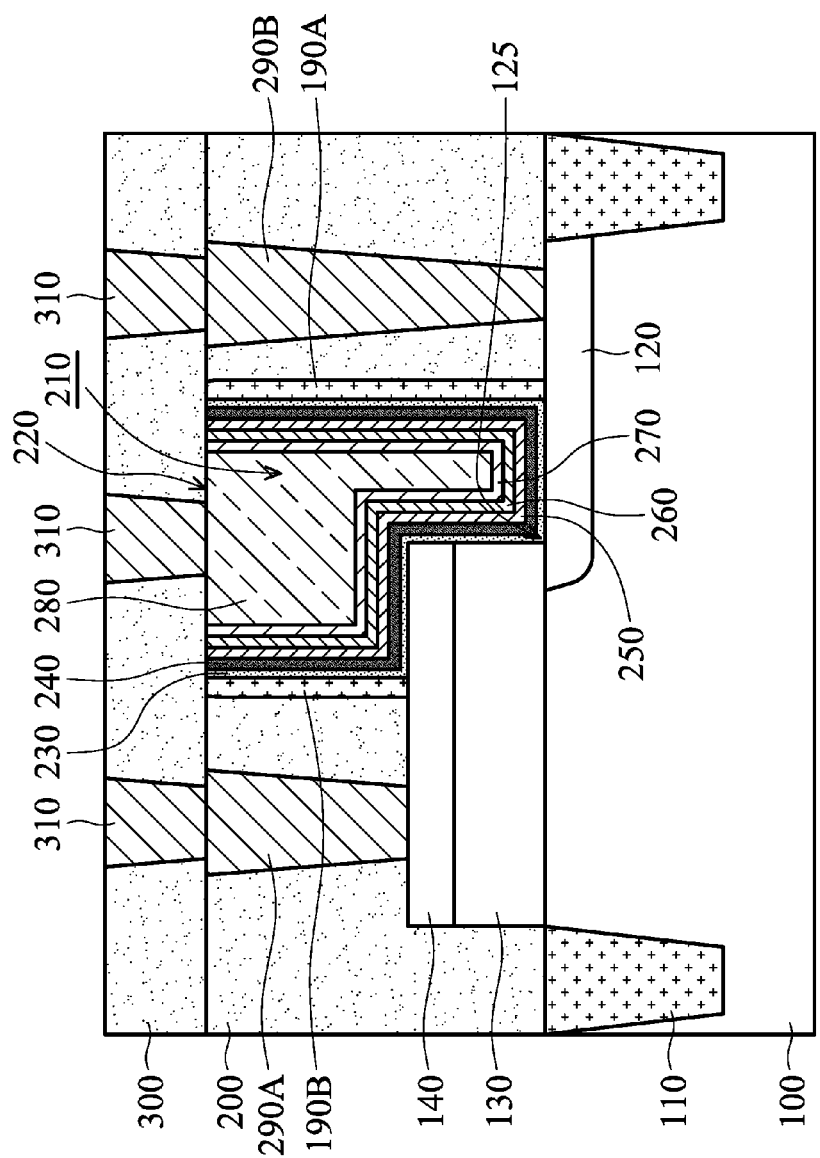

In accordance with some embodiments, conductive contacts are formed to electrically connect to conductive features in or over the semiconductor substrate 100. As shown in FIG. 1F, conductive contacts 290A and 290B are formed to be respectively electrically connected to the drain structure 140 and the source structure 120, in accordance with some embodiments. Since the source structure 120 is formed in the semiconductor substrate 100 and the drain structure 140 is formed over the semiconductor substrate 100, the conductive contacts 290A and 290B have different heights, in accordance with some embodiments. In some embodiments, the conductive contact 290A is shorter than the conductive contact 290B. In some embodiments, a portion of the drain structure 140 is sandwiched between the conductive contact 290A and the channel structure 130.

In some embodiments, the dielectric layer 200 is patterned to form contact openings that expose the conductive features such as the source structure 120 and the drain structure 140. Afterwards, a conductive material layer is deposited over the dielectric layer 200 to fill the contact openings. A planarization process is subsequently used to remove the portions of the conductive material layer outside of the contact openings. As a result, the remaining portions of the conductive material layer in the contact openings form the conductive contacts 290A and 290B.

In some embodiments, the conductive material layer is made of tungsten, aluminum, copper, gold, platinum, titanium, another suitable material, or a combination thereof. In some embodiments, the conductive material layer is deposited using a CVD process, a PVD process, an electroplating process, an electroless plating process, another applicable process, or a combination thereof.

As shown in FIG. 1F, a dielectric layer 300 and conductive contacts 310 are formed over the dielectric layer 200, in accordance with some embodiments. The conductive contacts 310 are in the dielectric layer 300. In some embodiments, the conductive contacts 310 are electrically connected to the gate stack 220 and the conductive contacts 290A and 290B.

In some embodiments, one of the conductive contacts 310 connected to the gate stack 220 overlaps the source structure 120. In some embodiments, one of the conductive contacts 310 connected to the gate stack 220 overlap the drain structure 140. The materials and/or formation methods of the dielectric layer 300 and the conductive contacts 310 are respectively similar to those of the dielectric layer 200 and the conductive contacts 290A and 290B, and therefore are not repeated.

According to some embodiments of the disclosure, one or more corners are built between the channel structure and the source structure and filled with the gate stack. As a result, electric field of TFETs is enhanced, and the improved electric field distribution is broader and extends into the channel structure. A region of the channel structure where tunneling probability is higher can overlap or align to a region of the channel structure where electric field is greater. When high tunneling probability and high electric field occur at substantially the same location in the channel structure, tunneling rate or efficiency is enhanced. Therefore, $I_{on}$ of TFETs is significantly increased and sub-threshold swing (S.S.) value of TFETs is lowered even further.

In accordance with some embodiments, as the angle θ of the corner becomes larger, the electric field distribution extending into the channel structure is broadened. As a result, it is much easier to achieve overlap between a region of the channel structure with higher tunneling probability and a region of the channel structure with better electric field. Accordingly, $I_{on}$ becomes greater and S.S. value becomes smaller as the angle θ of the corner enlarges. For example, $I_{on}$ of TFETs with an angle θ of about 90 degrees may be greater than that of TFETs with an angle θ of about 45 degrees, and may be less than that of TFETs with an angle θ of about 145 degrees.

In some embodiments of forming N-type TFETs, the angle θ is controlled to be in a range from about 30 degrees to about 145 degrees. On the other hand, in some embodiments of forming P-type TFETs, the angle θ is controlled to be in a range from about 30 degrees to about 125 degrees. In some cases, the angle θ should be substantially equal to or greater than about 30 degrees, such as the angle θ is substantially equal to or greater than about 45 degrees. If the angle θ is less than about 30 degrees, the electric field distribution barely expands into the channel structure. As a result, it may be difficult for a region with higher tunneling probability to overlap or align to a region with better electric field. However, embodiments of the disclosure are not limited thereto. In some other cases, the angle θ may be less than about 30 degrees.

In some cases of forming N-type TFETs, the angle θ should be substantially equal to or less than about 145 degrees. On the other hand, in some cases of forming P-type TFETs, the angle θ should be substantially equal to or less than about 125 degrees. Otherwise, the electric field distribution spreading into the channel structure is diluted and therefore the tunneling efficiency may be hardly enhanced. However, embodiments of the disclosure are not limited thereto. In some other cases of forming N-type TFETs, the angle θ may be greater than about 145 degrees. In some other cases of forming P-type TFETs, the angle θ may be greater than about 125 degrees.

Figure 2A:
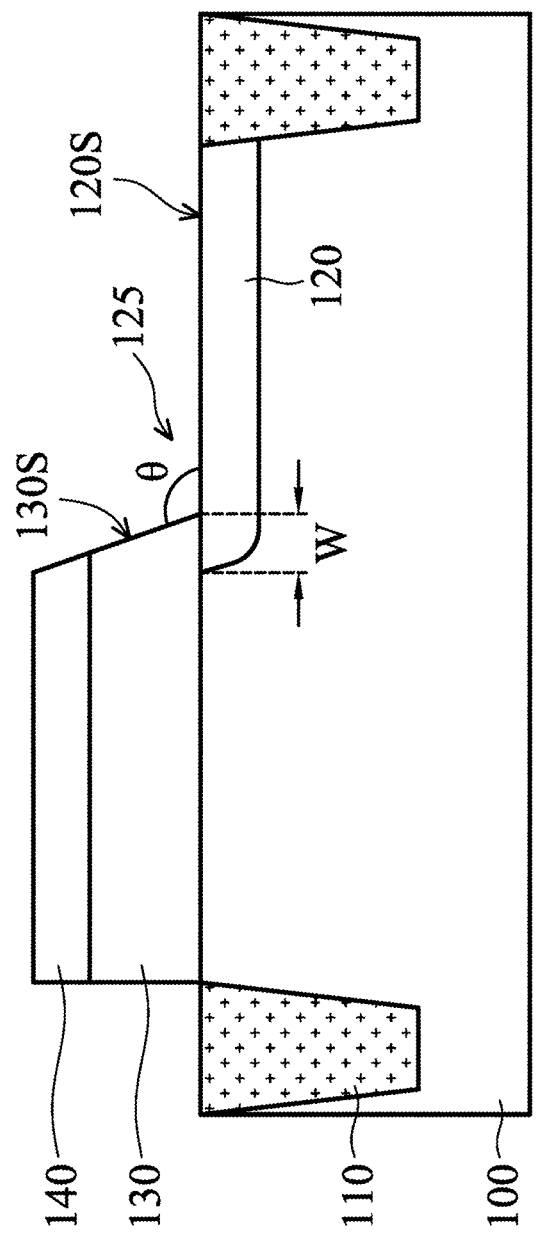
FIGS. 2A-2B are cross-sectional views of various stages of a process for forming a semiconductor device structure, in accordance with some embodiments.
Figure 2B:
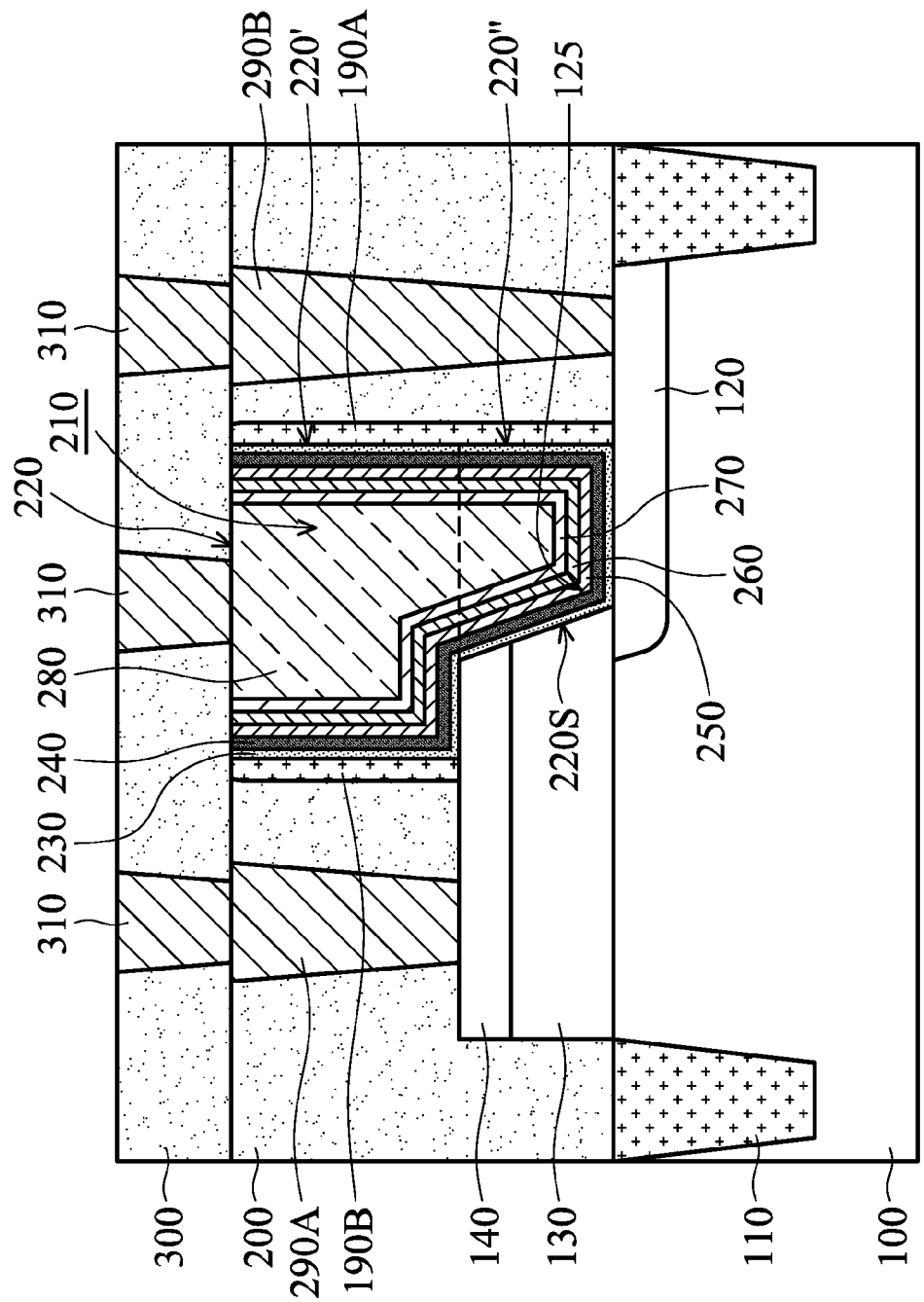

Many variations and/or modifications can be made to embodiments of the disclosure. For example, additional operations can be provided after the stage described in FIG. 1B and before the stage described in FIG. 1C. FIGS. 2A-2B are cross-sectional views of various stages of a process for forming a semiconductor device structure, in accordance with some embodiments. In some embodiments, the process for forming the semiconductor device structure shown in FIGS. 1A-1F can also be applied in the embodiments illustrated in FIGS. 2A-2B. The materials and/or formation methods of the semiconductor device structure are illustrated in the embodiments mentioned above, and are not repeated.

In accordance with some embodiments, a semiconductor device structure that shown in FIG. 1B is provided. Subsequently, the profile of the channel structure 130 is tuned. As shown in FIG. 2A, the sidewall 130S of the channel structure 130 becomes inclined to the top surface 120S of the source structure 120. As a result, the angle θ between the sidewall 130S and the top surface 120S is varied. For example, the angle θ can be increased to improve $I_{on}$ of TFETs.

In some embodiments, a sidewall portion of the channel structure 130 adjacent to the source structure 120 is partially removed so as to change the profile of the channel structure 130 and modify the angle θ. In some embodiments, an etching process is performed to partially remove the channel structure 130. In some embodiments, the etching process includes a wet etching process, a dry etching process, another applicable process, or a combination thereof. The conditions of the etching process are fine-tuned to tilt the sidewall of the channel structure 130. As a result, the channel structure 130 has a tilted sidewall 130S adjacent to the source structure 120. In some other embodiments, sidewall portions of the channel structure 130 and the drain structure 140 adjacent to the source structure 120 are partially removed. As a result, each of the channel structure 130 and the drain structure 140 has a tilted sidewall adjacent to the source structure 120.

In some embodiments, the channel structure 130 with the tilted sidewall 130S has a portion sandwiched between the drain structure 140 and the source structure 120. The portion of the channel structure 130 serves as a channel region of transistors. In some embodiments, the channel region of transistors is inclined to the top surface 120S of the source structure 120.

Afterwards, the processes for forming the semiconductor device structure shown in FIGS. 1C-1F are performed over the semiconductor device structure shown in FIG. 2A. As a result, the semiconductor device structure with gate stack 220 having a tilted sidewall 220S shown in FIG. 2B is fabricated. In some embodiments, the sidewall 220S is inclined to the top surface 120S of the source structure 120, and adjoins the channel structure 130 and the drain structure 140.

Embodiments of the disclosure can be applied to not only a semiconductor device structure with P-type or N-type TFETs but also a semiconductor device structure with complementary TFETs (CTFETs). FIGS. 3A-3G are cross-sectional views of various stages of a process for forming a semiconductor device structure, in accordance with some embodiments. Additional operations can be provided before, during, and/or after the stages described in FIGS. 3A-3G. Some of the stages that are described can be replaced or eliminated for different embodiments. In some embodiments, the materials and/or formation methods of a semiconductor device structure with CTFETs are similar to those of the described semiconductor device structure with P-type or N-type TFETs, and are not repeated.

Figure 3A:
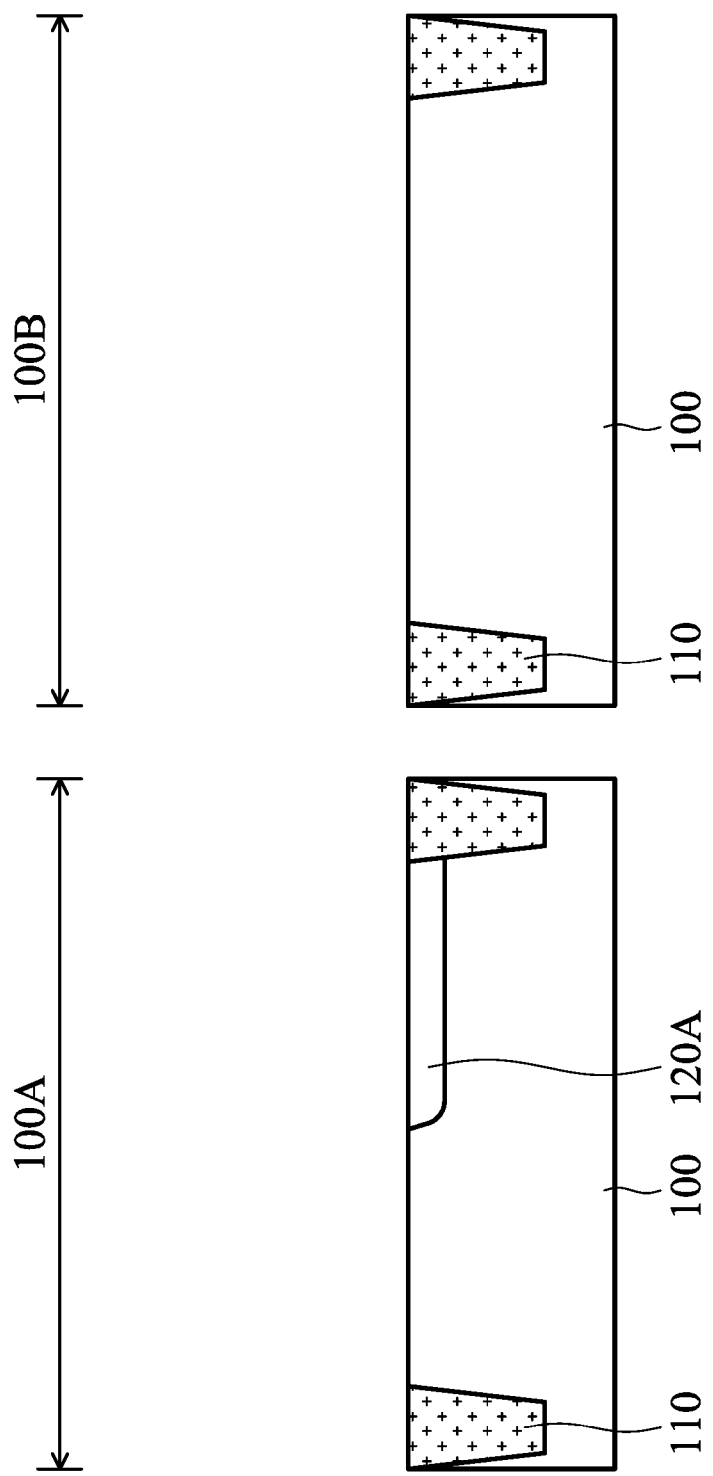
FIGS. 3A-3G are cross-sectional views of various stages of a process for forming a semiconductor device structure, in accordance with some embodiments.

As shown in FIG. 3A, a semiconductor device structure similar to that shown in FIG. 1A is provided. The semiconductor substrate 100 is divided into multiple regions including regions 100A and 100B. In some embodiments, P-type TFETs are configured to be formed in the region 100A, and N-type TFETs are configured to be formed in the region 100B. In some other embodiments, N-type TFETs are configured to be formed in the region 100A, and P-type TFETs are configured to be formed in the region 100B.

Like the embodiments illustrated in FIG. 1A, a source structure 120A is formed in the semiconductor substrate 100 in the region 100A, as shown in FIG. 3A in accordance with some embodiments. In some embodiments, the source structure 120A is doped with one or more N-type or P-type dopants. In some embodiments, an implantation mask (not shown) is used to ensure that the semiconductor substrate 100 in the region 100A is doped to form the source structure 120 while the semiconductor substrate 100 in the region 100B is not doped. For example, the implantation mask has an opening exposing a portion of the region 100A without exposing the region 100B.

Figure 3B:
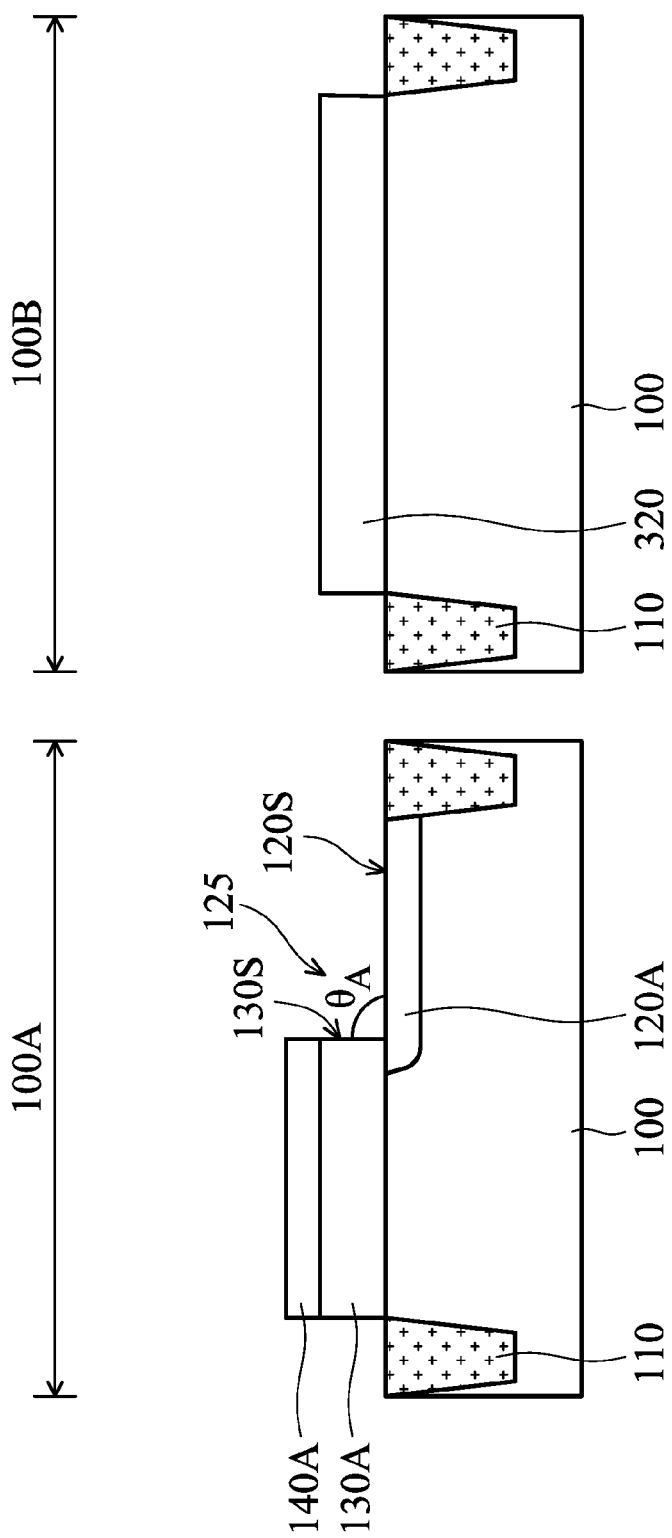

As shown in FIG. 3B, as with the embodiments illustrated in FIG. 1B, a channel structure 130A is formed over the semiconductor substrate 100 in the region 100A, in accordance with some embodiments. In some embodiments, a corner 125 with an angle $θ_A$ is created between the channel structure 130A and the source structure 120A.

As shown in FIG. 3B, a semiconductor material layer 320 is formed over the semiconductor substrate 100 in the region 100B, in accordance with some embodiments. In some embodiments, the semiconductor material layer 320 includes silicon or another elementary semiconductor material such as germanium. In some other embodiments, the semiconductor material layer 320 includes a compound semiconductor. The compound semiconductor may include silicon germanium, gallium arsenide, silicon carbide, indium arsenide, indium phosphide, another suitable compound semiconductor, or a combination thereof.

In some embodiments, the semiconductor material layer 320 and the semiconductor substrate 100 include or are made of different materials. For example, the semiconductor material layer 320 includes silicon germanium and the semiconductor substrate 100 includes silicon. In some embodiments, the semiconductor material layer 320 and the channel structure 130A include or are made of the same material. In some other embodiments, the semiconductor material layer 320 and the channel structure 130A include or are made of different materials.

In some embodiments, a patterned mask layer is formed over the semiconductor substrate 100 to assist in the formation of the semiconductor material layer 320. The patterned mask layer has an opening exposing a portion of the semiconductor substrate 100 in the region 100B. In some embodiments, the patterned mask layer is made of silicon oxide, silicon nitride, another suitable material, or a combination thereof.

Afterwards, one or more semiconductor materials are selectively deposited over the semiconductor substrate 100 in the region 100B. As a result, the semiconductor material layer 320 is formed in the region 100B. The patterned mask layer is subsequently removed. In some embodiments, the semiconductor material is deposited using a SEG process, a CVD process (e.g., a VPE process, a LPCVD process, and/or an UHV-CVD process), a molecular beam epitaxy process, another applicable process, or a combination thereof. In some embodiments, the semiconductor material layer 320 and the channel structure 130A are formed in the same stage. For example, the same patterned mask layer is used to assist in the formations of the semiconductor material layer 320 and the channel structure 130A. In some other embodiments, the semiconductor material layer 320 and the channel structure 130A are formed in different stages. For example, different patterned mask layers are used to separately assist in the formations of the channel structure 130 and the drain structure 140.

As shown in FIG. 3B, as with the embodiments illustrated in FIG. 1B, a drain structure 140A is formed over the channel structure 130A in the region 100A, in accordance with some embodiments. In some embodiments, the drain structure 140A is doped with one or more N-type or P-type dopants. In some embodiments, the dopants in the drain structure 140A and the source structure 120A are different types. In some embodiments, the drain structure 140A is formed after the formation of the semiconductor material layer 320. In some other embodiments, the drain structure 140A is formed before the formation of the semiconductor material layer 320.

Figure 3C:
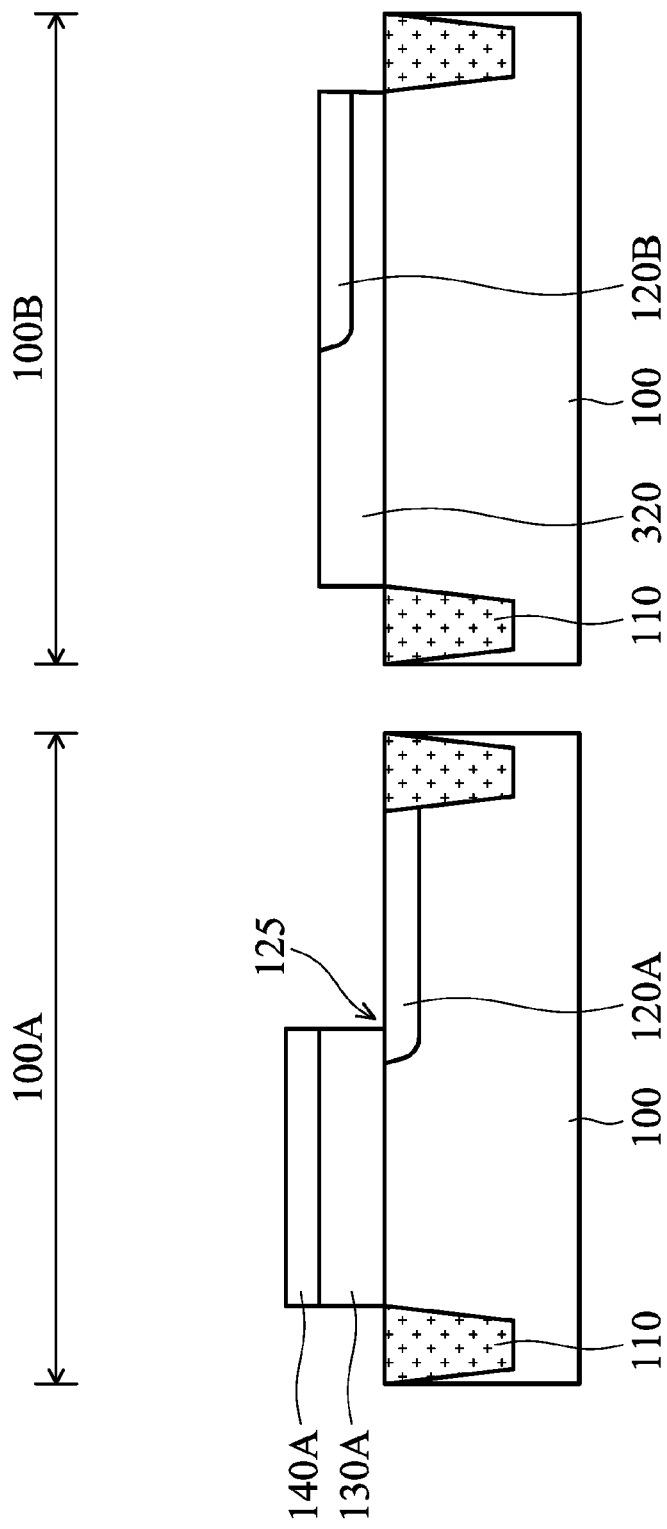

As shown in FIG. 3C, a source structure 120B is formed in the semiconductor material layer 320 in the region 100B, in accordance with some embodiments. In some embodiments, the source structure 120B is doped with one or more N-type or P-type dopants. In some embodiments, the dopants in the source structure 120A and 120B are different types.

In some embodiments, one or multiple implantation processes are performed over the semiconductor material layer 320 so as to form the source structure 120B. In some embodiments, an implantation mask is used to ensure that the semiconductor material layer 320 in the region 100B is doped to form the source structure 120B while the structure in the region 100A is not doped. For example, the implantation mask has an opening exposing a portion of the region 100B without exposing the region 100A. In some embodiments, the source structure 120B is formed after the formation of the drain structure 140A. In some other embodiments, the source structure 120B is formed before the formation of the drain structure 140A. The materials and/or formation methods of the source structure 120B are the same as or similar to those of the source structure 120.

Figure 3D:
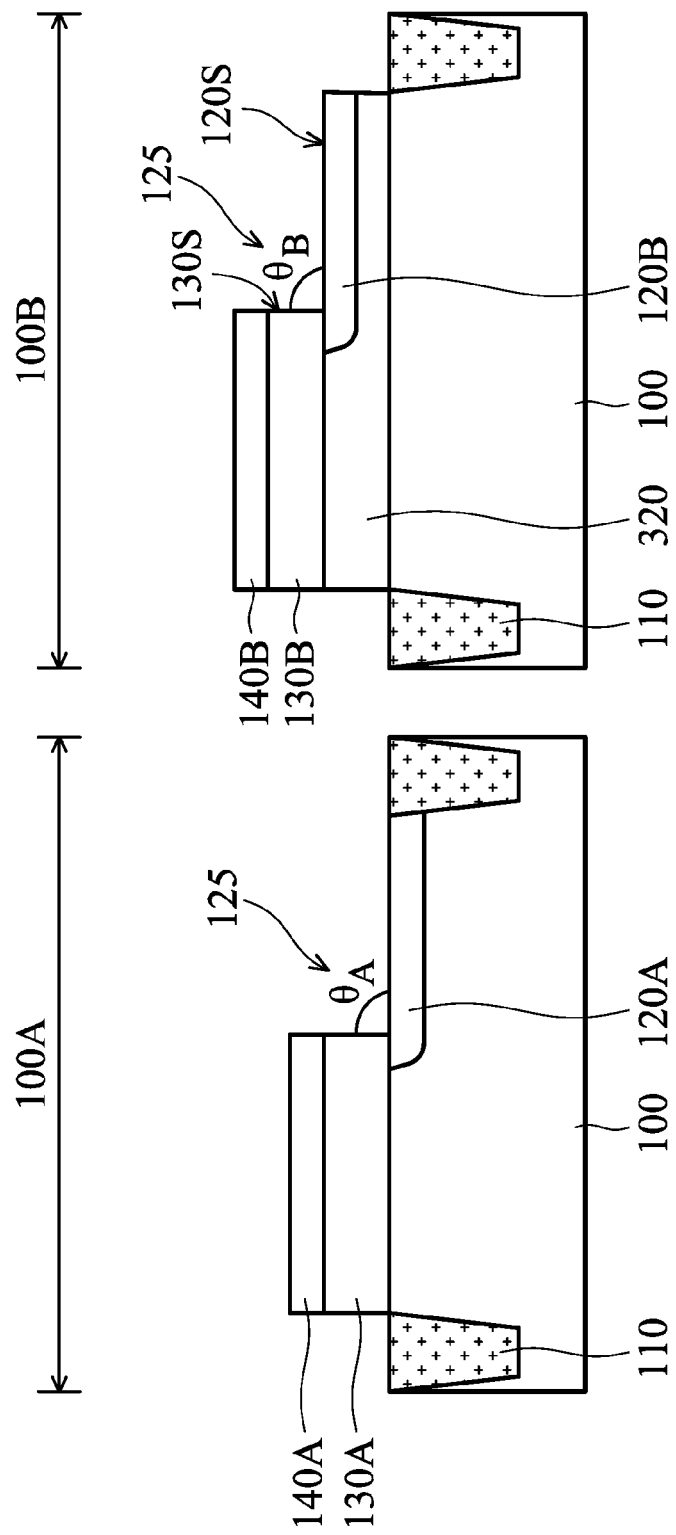

As shown in FIG. 3D, a channel structure 130B is formed over the semiconductor material layer 320 in the region 100B, in accordance with some embodiments. In some embodiments, a corner 125 with an angle $\theta_B$ is created between the channel structure 130B and the source structure 120B. In some embodiments, the angle $\theta_B$ in the region 100B and the angle $\theta_A$ in the region 100A are the same. In some embodiments, the angle $\theta_B$ in the region 100B and the angle $\theta_A$ in the region 100A are different.

In some embodiments, the channel structures 130A and 130B include or are made of different materials suitable for the P-type TFET and the N-type TFET. For example, the channel structure 130A includes silicon germanium and the channel structure 130B includes silicon. In some other embodiments, the channel structures 130A and 130B include or are made of the same material. The materials and/or formation methods of the channel structure 130B are the same as or similar to those of the channel structure 130.

As shown in FIG. 3D, a drain structure 140B is formed over the channel structure 130B in the region 100B, in accordance with some embodiments. In some embodiments, the drain structure 140B is doped with one or more N-type or P-type dopants. In some embodiments, the dopants in the drain structure 140B and the source structure 120B are different types. In some embodiments, the dopants in the drain structure 140B and the drain structure 140A are different types.

In some embodiments, the drain structures 140A and 140B include or are made of different materials suitable for the P-type TFET and the N-type TFET. For example, the drain structure 140A includes silicon germanium and the drain structure 140B includes silicon. In some other embodiments, the drain structures 140A and 140B include the same material. The materials and/or formation methods of the drain structure 140B are the same as or similar to those of the drain structure 140.

Figure 3E:
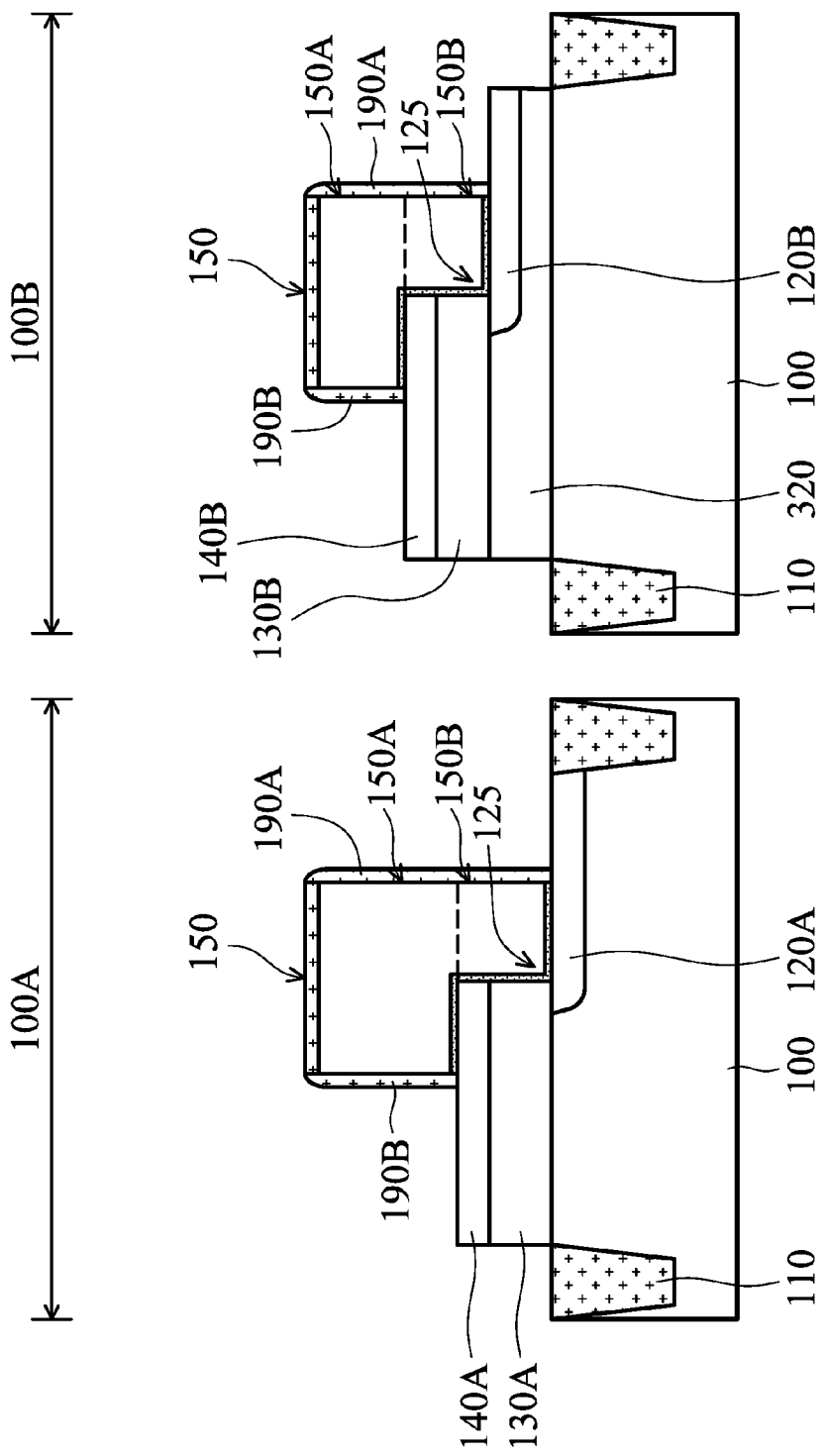

As shown in FIG. 3E, as with the embodiments illustrated in FIG. 1C, gate stacks 150 are formed and fill the corner 125 with the angle $\theta_A$ in the region 100A and the corner 125 with the angle $\theta_B$ in the region 100B, in accordance with some embodiments. In some embodiments, the gate stacks 150 in the regions 100A and 100B have different heights. For example, the gate stack 150 in the region 100A is taller than the gate stack 150 in the region 100B. In some other embodiments, the gate stacks 150 in the regions 100A and 100B have the same height. In some embodiments, the gate stacks 150 in the regions 100A and 100B are formed in the same stage. In some other embodiments, the gate stacks 150 in the regions 100A and 100B are formed in different stages.

Afterwards, as with the embodiments illustrated in FIG. 1C, spacer elements 190A and 190B are formed over sidewalls of the gate stacks 150, as shown in FIG. 3E in accordance with some embodiments. In some embodiments, the spacer elements 190A in the regions 100A and 100B have different heights. In some other embodiments, the spacer elements 190A in the regions 100A and 100B have the same height. In some embodiments, the spacer elements 190B in the regions 100A and 100B have different heights.

In some other embodiments, the spacer elements 190B in the regions 100A and 100B have the same height.

Figure 3F:
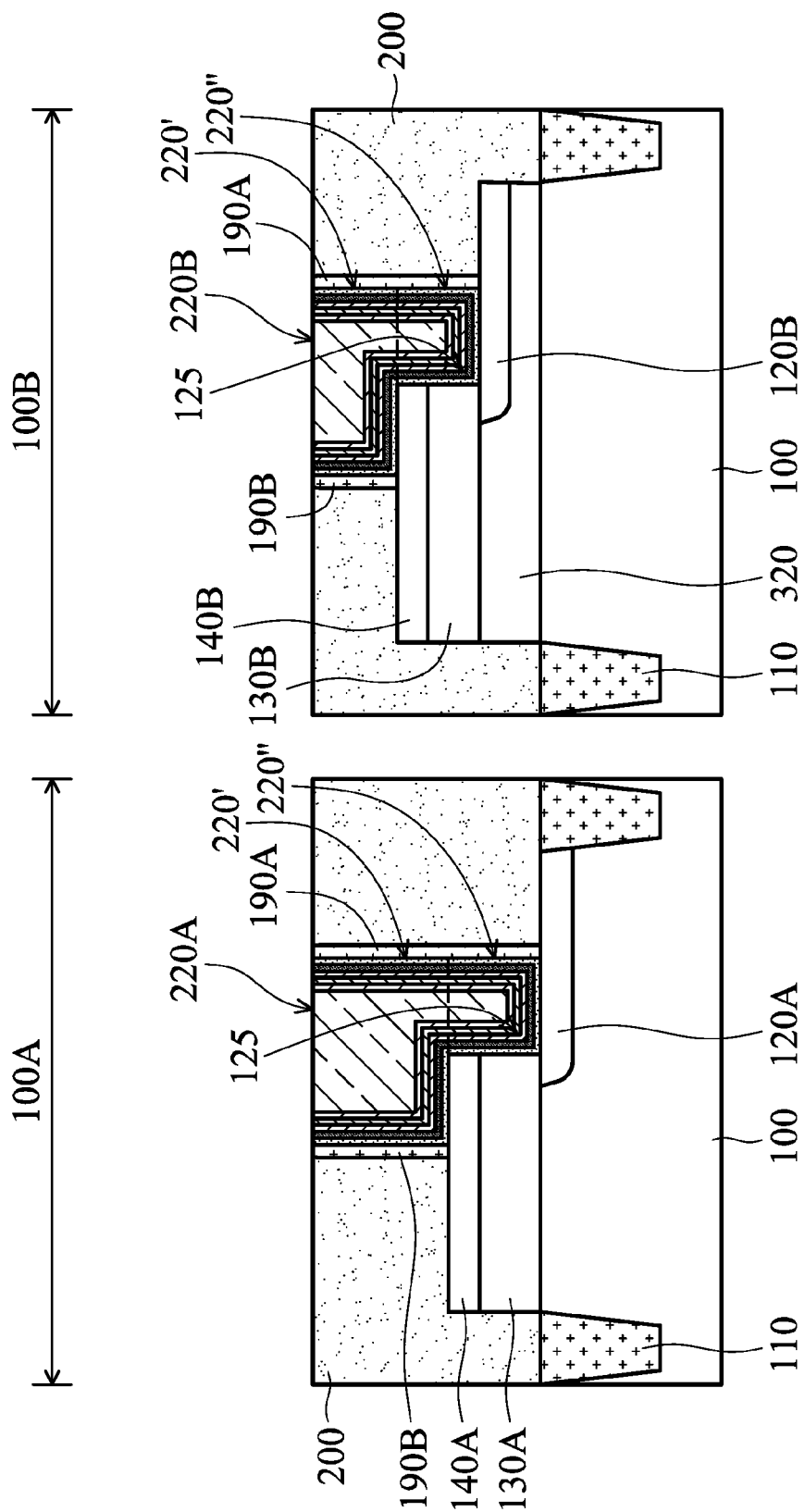

Like the embodiments illustrated in FIG. 1D, a dielectric layer 200 is deposited over the semiconductor substrate 100 in the regions 100A and 100B, as shown in FIG. 3F in accordance with some embodiments. Afterwards, as with the embodiments illustrated in FIG. 1E, the gate stacks 150 in the regions 100A and 100B may be respectively replaced with gate stacks 220A and 220B. In some embodiments, the thickness and/or the composition of the work function layers of the gate stacks 220A and 220B are separately fine-tuned to adjust the work function level suitable for the P-type TFET and the N-type TFET. For example, the work function layers of the gate stacks 220A and 220B may be metal layers with different types and may be formed in different stages.

Figure 3G:
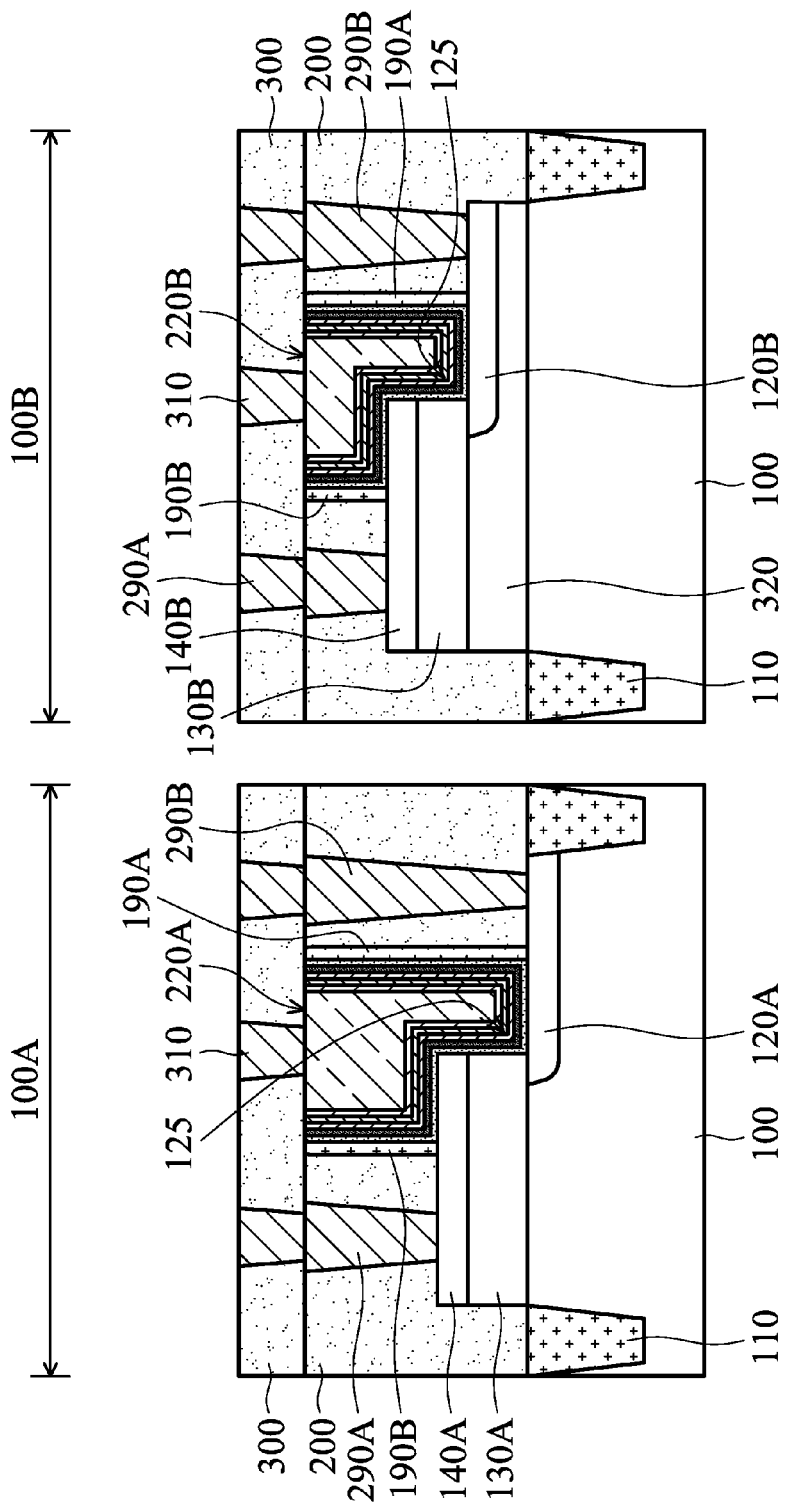

Like the embodiments illustrated in FIG. 1F, conductive contacts 290A and 290B are formed in the dielectric layer 200 in the regions 100A and 100B, as shown in FIG. 3G in accordance with some embodiments. In some embodiments, the conductive contacts 290A and 290B are respectively electrically connected to the drain structures 140A and 140B and the source structures 120A and 120B. In some embodiments, the conductive contacts 290A in the regions 100A and 100B have different heights. In some other embodiments, the conductive contacts 290A in the regions 100A and 100B have the same height. In some embodiments, the conductive contacts 290B in the regions 100A and 100B have different heights. In some other embodiments, the conductive contacts 290B in the regions 100A and 100B have the same height.

Afterwards, as with the embodiments illustrated in FIG. 1F, a dielectric layer 300 and conductive contacts 310 are formed over the dielectric layer 200 in the regions 100A and 100B, as shown in FIG. 3G in accordance with some embodiments.

Many variations and/or modifications can be made to embodiments of the disclosure. For example, the semiconductor device structure is not limited to include single gate. In some other embodiments, the semiconductor device structure includes multiple gates, such as tri-gates. In some embodiments, the materials and/or formation methods of a semiconductor device structure with multiple gate TFETs are similar to those of the described semiconductor device structure, and are not repeated.

Figure 4A:
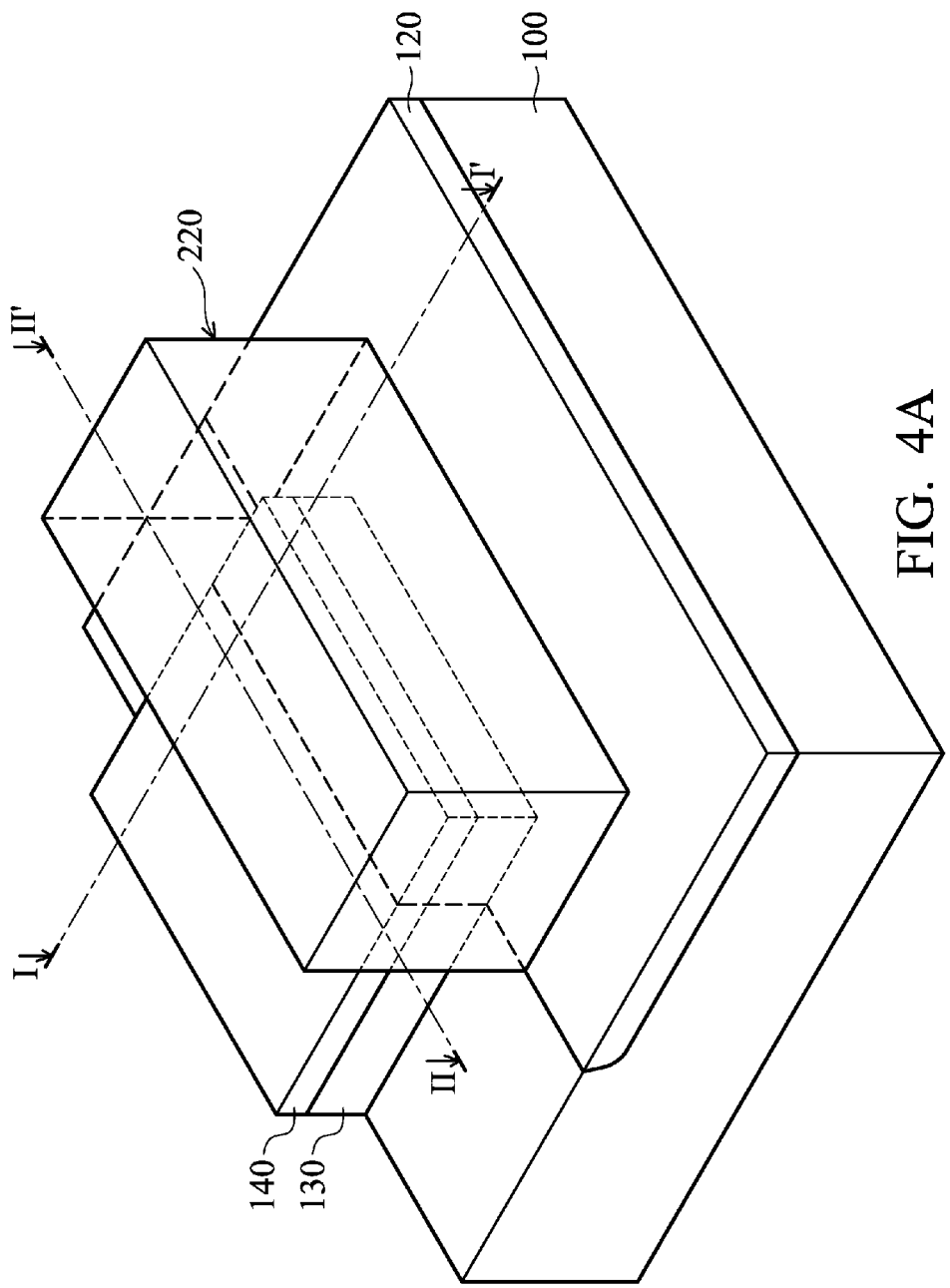
FIG. 4A is a perspective view of a semiconductor device structure, in accordance with some embodiments.
Figure 4B:
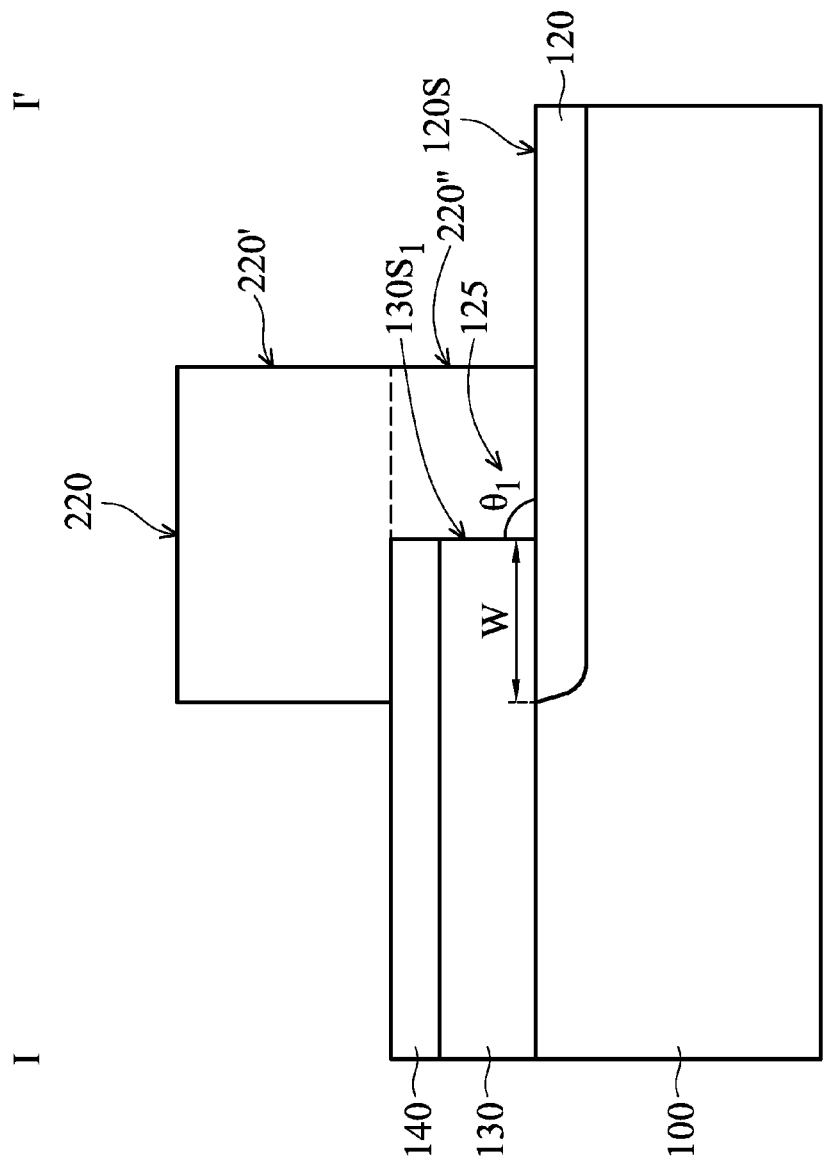
FIGS. 4B-4C are cross-sectional views of a semiconductor device structure, in accordance with some embodiments.
Figure 4C:
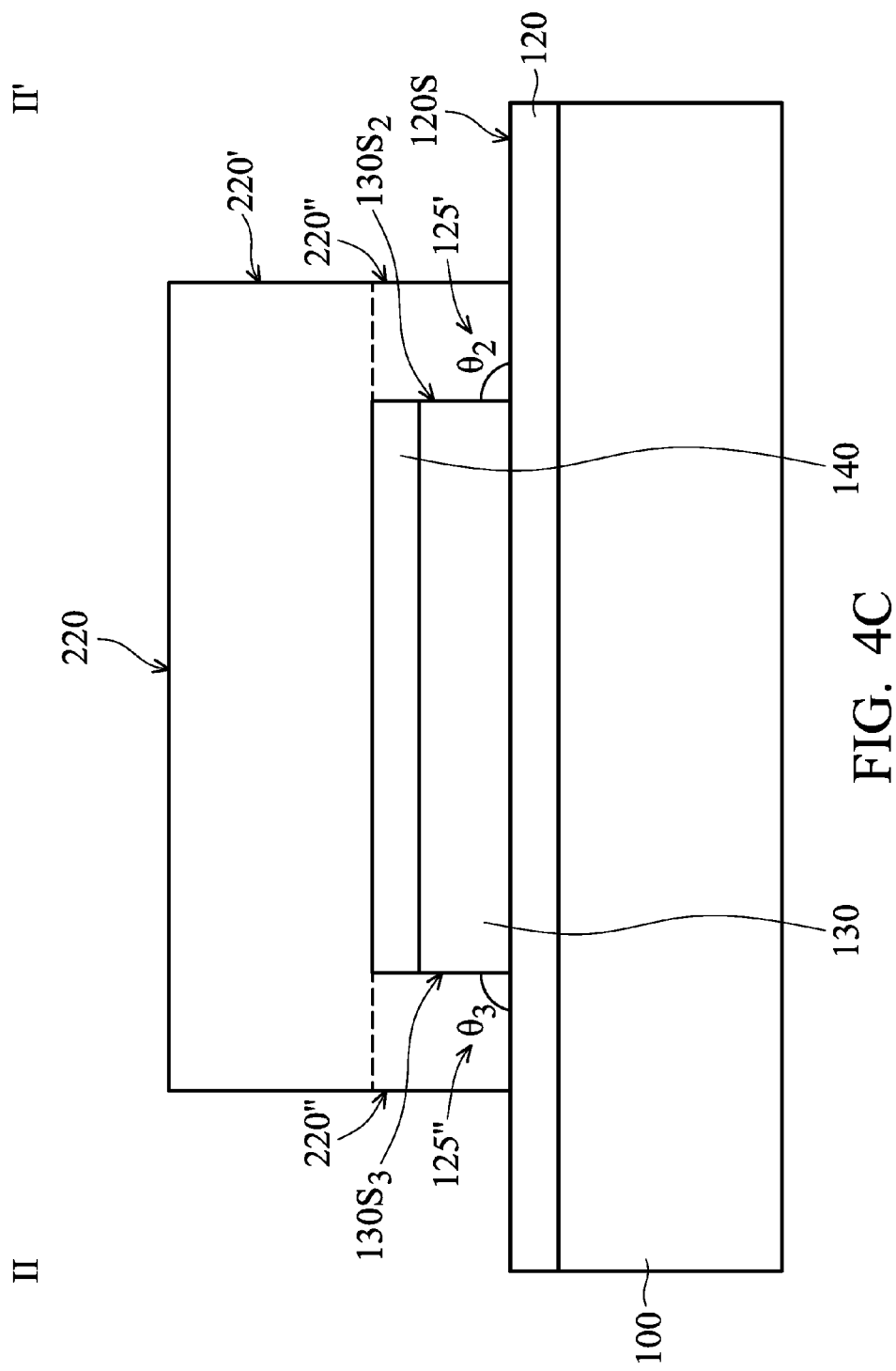

FIG. 4A is a perspective view of a semiconductor device structure, in accordance with some embodiments. FIGS. 4B-4C are cross-sectional views of a semiconductor device structure, in accordance with some embodiments. FIGS. 4B and 4C show a portion of the semiconductor device structure taken along lines I-I' and II-IF in FIG. 4A, respectively. Only the semiconductor substrate 100, the source structure 120, the channel structure 130, the drain structure 140, and the gate stack 220 are shown in FIGS. 4A-4C for a better understanding of the structure.

As shown in FIG. 4A, the channel structure 130 and the gate stack 220 cover the source structure 120 in the semiconductor substrate 100, in accordance with some embodiments. In some embodiments, the gate stack 220 adjoins multiple sidewalls of the channel structure 130 over the source structure 120. For example, the gate stack 220 adjoins three sidewalls of the channel structure 130. As a result, a portion of the gate stack 220 fills three corners 125 between the three sidewalls of the channel structure 130 and the top surface of the source structure 120. In some other embodiments, the gate stack 220 adjoins two or more than three sidewalls of the channel structure 130.

As shown in FIG. 4A, the drain structure 140 covers the channel structure 130, in accordance with some embodiments. In some embodiments, the gate stack 220 adjoins multiple sidewalls of the drain structure 140 over the channel structure 130. For example, the gate stack 220 adjoins three sidewalls of the drain structure 140. In some other embodiments, the gate stack 220 adjoins two or more than three sidewalls of the drain structure 140.

As shown in FIGS. 4A and 4B, one corner 125 is formed between a top surface 120S of the source structure 120 and a sidewall 130S$_1$ of the channel structure 130, in accordance with some embodiments. A portion of the gate stack 220 fills the corner 125 between the sidewall 130S$_1$ and the top surface 120S. The corner 125 between the sidewall 130S$_1$ and the top surface 120S has an angle $\theta_1$.

As shown in FIGS. 4A and 4C, two corners 125' and 125" are formed between the top surface 120S and sidewalls 130S$_2$ and 130S$_3$ connecting the sidewall 130S$_1$, in accordance with some embodiments. The gate stack 220 further fills the corners 125' and 125" between the top surface 120S and the sidewalls 130S$_2$ and 130S$_3$. The corner 125' between the sidewall 130S$_2$ and the top surface 120S has an angle $\theta_2$. The corner 125" between the sidewall 130S$_3$ and the top surface 120S has an angle $\theta_3$. In some embodiments, the angles $\theta_1$, $\theta_2$ and $\theta_3$ are the same. In some embodiments, one of the angles $\theta_1$, $\theta_2$ and $\theta_3$ is different from the others. In some other embodiments, the angles $\theta_1$, $\theta_2$ and $\theta_3$ are different from one another.

According to some embodiments of the disclosure, the gate stack adjoins multiple sidewalls of the channel structure. The channel region of the TFET is broadened. As a result, $I_{on}$ is further enhanced. Therefore, the device performance of the TFET is greatly improved.

Figure 5:
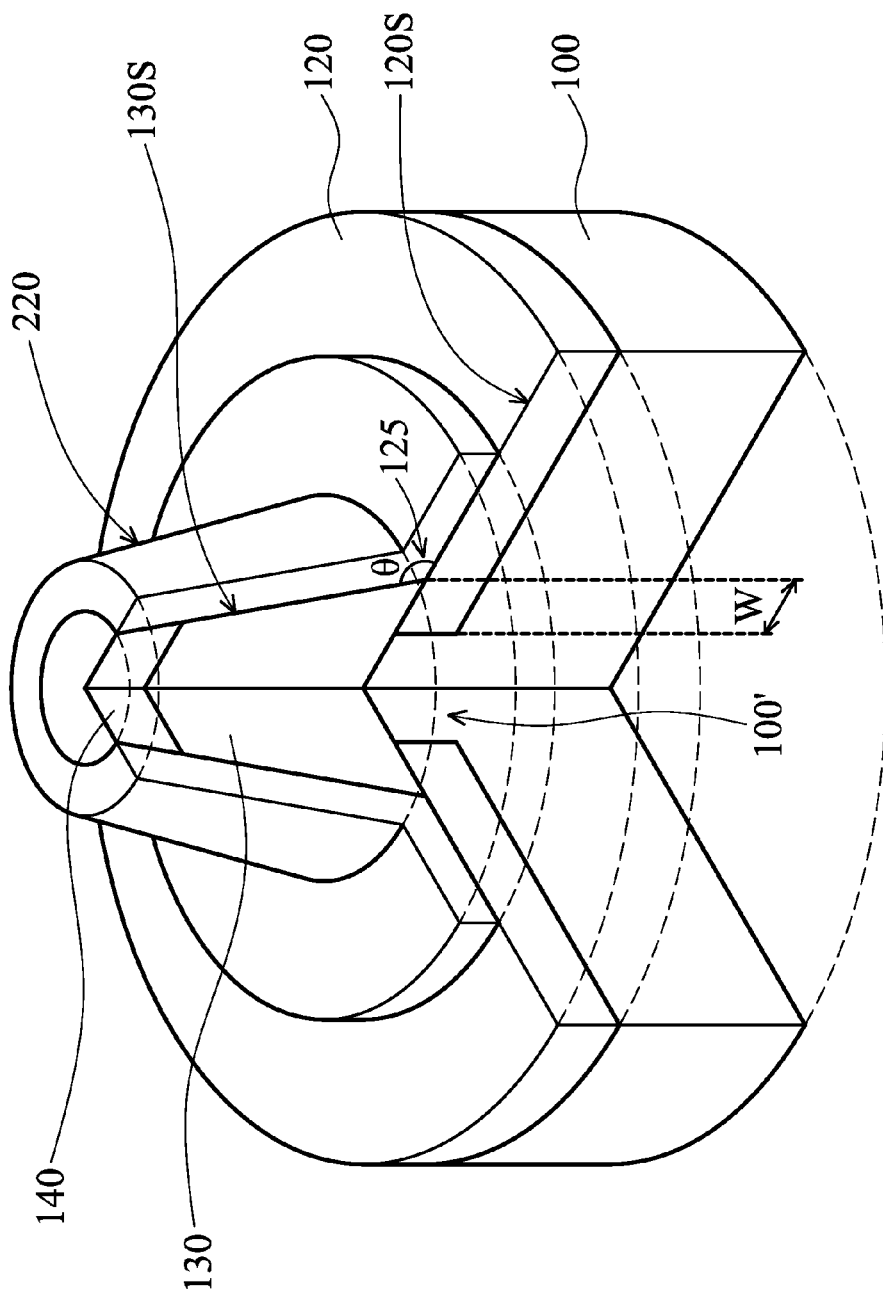
FIG. 5 is a perspective view of a semiconductor device structure, in accordance with some embodiments.

Many variations and/or modifications can be made to embodiments of the disclosure. For example, the semiconductor device structure may include nanowires. FIG. 5 is a perspective view of a semiconductor device structure, in accordance with some embodiments. In some embodiments, the materials and/or formation methods of a semiconductor device structure with nanowires are similar to those of the described semiconductor device structure, and are not repeated. Only the semiconductor substrate 100, the source structure 120, the channel structure 130, the drain structure 140, and the gate stack 220 are shown in FIG. 5 for a better understanding of the structure.

As shown in FIG. 5, the source structure 120 in the semiconductor substrate 100 surrounds a portion 100' of the semiconductor substrate 100, in accordance with some embodiments. The channel structure 130 covers the portion 100' and a portion of the source structure 120. The drain structure 140 covers the channel structure 130, and a portion of the channel structure 130 is sandwiched between the drain structure 140 and the source structure 120. The portion of the channel structure 130 serves as a channel region of a transistor.

As shown in FIG. 5, a portion of the gate stack 220 fills a corner 125 between the channel structure 130 and the source structure 120, in accordance with some embodiments. In some embodiments, the gate stack 220 is conformally deposited over the source structure 120, the channel structure 130 and the drain structure 140. In some embodiments, the gate stack 220 continuously surrounds the channel structure 130. In some embodiments, the gate stack 220 continuously surrounds the drain structure 140. In some embodiments, the gate stack 220 extends further over the drain structure 140.

According to some embodiments of the disclosure, the channel structure is enclosed by the gate stack. The area of the channel region is increased. As a result of the expanded tunneling region, $I_{on}$ is enhanced even further.

Embodiments of the disclosure form a semiconductor device structure with a TFET. The TFET includes a channel structure and a drain structure that are raised over a source structure. A corner is built between the channel structure and the source structure and is filled with a gate stack. As a result, electric field of TFETs is enhanced, and the improved electric field distribution is broader and extends into the channel structure. When high tunneling probability and high electric field occur at substantially the same region in the channel structure, tunneling efficiency is enhanced. Therefore, $I_{on}$ of TFETs is significantly increased and the performance of the semiconductor device structure is greatly improved.

In accordance with some embodiments, a semiconductor device structure is provided. The semiconductor device structure includes a source structure at least partially in a semiconductor substrate. The semiconductor device structure also includes a channel structure over the semiconductor substrate. The source structure is partially covered by the channel structure. The semiconductor device structure further includes a drain structure covering the channel structure. The drain structure and the source structure have different conductivity types. A portion of the channel structure is sandwiched between the source structure and the drain structure. In addition, the semiconductor device structure includes a gate stack partially covering the channel structure.

In accordance with some embodiments, a semiconductor device structure is provided. The semiconductor device structure includes a gate stack over a semiconductor substrate. The semiconductor device structure also includes a channel structure over the semiconductor substrate and adjoining a sidewall of the gate stack. The semiconductor device structure further includes a source structure at least partially in the semiconductor substrate and overlapping the gate stack and the channel structure. In addition, the semiconductor device structure includes a drain structure covering the channel structure. The drain structure and the source structure have different conductivity types.

In accordance with some embodiments, a method for forming a semiconductor device structure is provided. The method includes forming a source structure in or over a semiconductor substrate. The method also includes forming a channel structure over the semiconductor substrate so that a corner is created between the channel structure and the source structure. The method further includes forming a drain structure covering the channel structure. In addition, the method includes forming a gate stack on a portion of the channel structure. A portion of the gate stack is in the corner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a source structure at least partially in a semiconductor substrate;
    a channel structure over the semiconductor substrate, wherein the source structure is partially covered by the channel structure so that there is a corner between the channel structure and the source structure;
    a drain structure covering the channel structure, wherein the drain structure and the source structure have different conductivity types, and wherein a portion of the channel structure is sandwiched between the source structure and a bottom surface of the drain structure; and
    a gate stack partially covering the channel structure, wherein the gate stack fills the corner and extends from the corner further over a top surface of the drain structure.

2. The semiconductor device structure as claimed in claim 1, wherein a sidewall of the portion of the channel structure is substantially perpendicular to a top surface of the source structure.

3. The semiconductor device structure as claimed in claim 1, wherein a sidewall of the portion of the channel structure is inclined to a top surface of the source structure.

4. The semiconductor device structure as claimed in claim 1, wherein the gate stack adjoins a sidewall of the portion of the channel structure.

5. The semiconductor device structure as claimed in claim 4, wherein the portion of the channel structure further comprises a second sidewall connecting the sidewall, and the gate stack further adjoins the second sidewall.

6. The semiconductor device structure as claimed in claim 1, wherein the gate stack continuously surrounds the channel structure.

7. The semiconductor device structure as claimed in claim 1, further comprising spacer elements over sidewalls of the gate stack, wherein one of the spacer elements overlaps the channel structure.

8. The semiconductor device structure as claimed in claim 1, wherein the channel structure partially overlaps the source structure and has a sidewall that is inclined to the bottom surface of the drain structure.

9. A semiconductor device structure, comprising:
    a gate stack over a semiconductor substrate;
    a channel structure over the semiconductor substrate and adjoining a sidewall of the gate stack;
    a source structure at least partially in the semiconductor substrate and overlapping the gate stack and the channel structure, wherein there is a corner between the channel structure and the source structure and filled with the gate stack; and
    a drain structure covering the channel structure and having a sidewall adjoining the gate stack, wherein the drain structure and the source structure have different conductivity types, and the gate stack extends from the corner further over a top surface of the drain structure.

10. The semiconductor device structure as claimed in claim 9, wherein the sidewall of the gate stack is substantially perpendicular to a top surface of the source structure.

11. The semiconductor device structure as claimed in claim 9, wherein the sidewall of the gate stack is inclined to a top surface of the source structure.

12. The semiconductor device structure as claimed in claim 9, wherein a bottom surface of the gate stack is below a top surface of the channel structure.

13. The semiconductor device structure as claimed in claim 9, wherein a bottom surface of the drain structure is over a top surface of the source structure.

14. The semiconductor device structure as claimed in claim 9, wherein one or more sidewalls of the channel structure adjoin the gate stack.

15. The semiconductor device structure as claimed in claim 9, further comprising a conductive contact over the drain structure, wherein a portion of the drain structure is sandwiched between the conductive contact and the channel structure.

16. A method for forming a semiconductor device structure, comprising:
   forming a source structure in or over a semiconductor substrate;
   forming a channel structure over the semiconductor substrate so that a corner is created between the channel structure and a top surface of the source structure;
   forming a drain structure covering the channel structure;
   modifying an angle of the corner; and
   forming a gate stack in the corner after the modification of the angle, wherein the gate stack extends from the corner further over a top surface of the drain structure above the top surface of the source structure.

17. The method for forming a semiconductor device structure as claimed in claim 16, wherein the modification of the angle comprises partially removing the channel structure.

18. The method for forming a semiconductor device structure as claimed in claim 16, wherein the formation of the channel structure comprises epitaxially growing a semiconductor material on the semiconductor substrate and the source structure.

19. The method for forming a semiconductor device structure as claimed in claim 16, further comprising forming spacer elements over sidewalls of the gate stack after the formation of the drain structure.

20. The method for forming a semiconductor device structure as claimed in claim 16, wherein the step of forming the channel structure further comprises forming the channel structure such that the top surface of the source structure is partially covered by the channel structure to create the corner, and wherein the corner is filled with a gate electrode of the gate stack.

* * * * *